US012777656B1

(12) United States Patent
Mukherjee et al.

(10) Patent No.: US 12,777,656 B1
(45) Date of Patent: *Oct. 27, 2026

(54) NON-LINEAR POLAR MATERIAL BASED DEVICE WITH UNIFORM POLARIZATION

(71) Applicant: Kepler Computing Inc., San Francisco, CA (US)

(72) Inventors: Niloy Mukherjee, San Ramon, CA (US); Ramamoorthy Ramesh, Moraga, CA (US); Sasikanth Manipatruni, Portland, OR (US); James Clarkson, El Sobrante, CA (US); FNU Antquzzamam, Orinda, CA (US); Gabriel Antonio Paulius Velarde, San Leandro, CA (US); Jason Y. Wu, Albany, CA (US)

(73) Assignee: Kepler Computing Inc., San Francisco, CA (US)

( * ) Notice: Subject to any disclaimer, the term of this patent is extended or adjusted under 35 U.S.C. 154(b) by 458 days.

This patent is subject to a terminal disclaimer.

(21) Appl. No.: 18/331,894

(22) Filed: Jun. 8, 2023

Related U.S. Application Data

(63) Continuation of application No. 17/315,139, filed on May 7, 2021, now Pat. No. 11,744,081, which is a continuation of application No. 17/315,111, filed on May 7, 2021, now Pat. No. 11,659,714.

(51) Int. Cl.

| | |
|---|---|
| ***H10B 51/20*** | (2023.01) |
| ***H10B 51/10*** | (2023.01) |
| ***H10B 51/40*** | (2023.01) |

(52) U.S. Cl.
CPC ............ *H10B 51/20* (2023.02); *H10B 51/10* (2023.02); *H10B 51/40* (2023.02)

(58) Field of Classification Search
CPC ......... H10B 51/20; H10B 51/10; H10B 51/40
See application file for complete search history.

(56) References Cited

U.S. PATENT DOCUMENTS

| | | | |
|---|---|---|---|
| 5,760,432 | A | 6/1998 | Abe et al. |
| 6,043,526 | A | 3/2000 | Ochiai |
| 6,274,388 | B1 | 8/2001 | Aggarwal et al. |
| 6,346,741 | B1 | 2/2002 | Buskirk et al. |
| 6,388,281 | B1 | 5/2002 | Jung et al. |

(Continued)

FOREIGN PATENT DOCUMENTS

| | | | |
|---|---|---|---|
| JP | H0982907 | A | 3/1997 |
| JP | H10242426 | A | 9/1998 |

(Continued)

OTHER PUBLICATIONS

1st Office Action notified Dec. 11, 2020 for Taiwan Patent Application No. 109106095.

(Continued)

*Primary Examiner* — Thanhha S Pham
(74) *Attorney, Agent, or Firm* — MUGHAL GAUDRY & FRANKLIN PC

(57) ABSTRACT

Described are ferroelectric device film stacks which include a templating or texturing layer or material deposited below a ferroelectric layer, to enable a crystal lattice of the subsequently deposited ferroelectric layer to template off this templating layer and provide a large degree of preferential orientation despite the lack of epitaxial substrates.

20 Claims, 10 Drawing Sheets

(56) References Cited

U.S. PATENT DOCUMENTS

| | | | | |
|---|---|---|---|---|
| 6,500,678 | B1 | 12/2002 | Aggarwal et al. | |
| 6,587,367 | B1 | 7/2003 | Nishimura et al. | |
| 6,656,748 | B2 | 12/2003 | Hall et al. | |
| 6,713,342 | B2 | 3/2004 | Celii et al. | |
| 6,720,600 | B2 | 4/2004 | Okita | |
| 6,728,128 | B2 | 4/2004 | Nishimura et al. | |
| 7,029,925 | B2 | 4/2006 | Celii et al. | |
| 11,659,714 | B1 * | 5/2023 | Mukherjee ............. | H10D 1/682 257/295 |
| 2002/0153550 | A1 | 10/2002 | An et al. | |
| 2003/0012984 | A1 | 1/2003 | Ueda | |
| 2003/0119211 | A1 | 6/2003 | Summerfelt et al. | |
| 2003/0129847 | A1 | 7/2003 | Celii et al. | |
| 2004/0089854 | A1 | 5/2004 | Chen et al. | |
| 2004/0104754 | A1 | 6/2004 | Bruchhaus et al. | |
| 2004/0129961 | A1 | 7/2004 | Araujo et al. | |
| 2005/0012126 | A1 | 1/2005 | Udayakumar et al. | |
| 2005/0214954 | A1 | 9/2005 | Maruyama et al. | |
| 2005/0230725 | A1 | 10/2005 | Aggarwal et al. | |
| 2005/0244988 | A1 | 11/2005 | Wang et al. | |
| 2006/0001070 | A1 | 1/2006 | Park et al. | |
| 2006/0006447 | A1 | 1/2006 | Kim et al. | |
| 2006/0073613 | A1 | 4/2006 | Aggarwal et al. | |
| 2006/0073614 | A1 | 4/2006 | Hara | |
| 2006/0134808 | A1 | 6/2006 | Summerfelt et al. | |
| 2006/0138507 | A1 | 6/2006 | Kijima et al. | |
| 2006/0258113 | A1 | 11/2006 | Sandhu et al. | |
| 2007/0275484 | A1 | 11/2007 | Mitsui | |
| 2007/0298521 | A1 | 12/2007 | Obeng et al. | |
| 2008/0073680 | A1 | 3/2008 | Wang | |
| 2008/0081380 | A1 | 4/2008 | Celii et al. | |
| 2008/0107885 | A1 | 5/2008 | Alpay et al. | |
| 2008/0191252 | A1 | 8/2008 | Nakamura et al. | |
| 2009/0003042 | A1 | 1/2009 | Lee et al. | |
| 2012/0313218 | A1 | 12/2012 | Fujimori et al. | |
| 2014/0247642 | A1 | 9/2014 | Madhan et al. | |
| 2015/0069481 | A1 | 3/2015 | Sun et al. | |
| 2015/0294702 | A1 | 10/2015 | Lee et al. | |
| 2017/0069735 | A1 | 3/2017 | Oh et al. | |
| 2018/0130823 | A1 * | 5/2018 | Kim ....................... | H10B 51/20 |
| 2018/0166453 | A1 | 6/2018 | Müller | |
| 2018/0226418 | A1 | 8/2018 | Morandi et al. | |
| 2018/0286987 | A1 | 10/2018 | Lee et al. | |
| 2018/0323309 | A1 | 11/2018 | Ando et al. | |
| 2018/0331113 | A1 | 11/2018 | Liao et al. | |
| 2019/0051815 | A1 | 2/2019 | Kakinuma et al. | |
| 2019/0115353 | A1 | 4/2019 | O'Brien et al. | |
| 2019/0138893 | A1 | 5/2019 | Sharma et al. | |
| 2020/0004583 | A1 | 1/2020 | Kelly et al. | |

FOREIGN PATENT DOCUMENTS

| | | | |
|---|---|---|---|
| JP | H1174488 | A | 3/1999 |
| JP | 2000174224 | A | 6/2000 |
| JP | 2001237393 | A | 8/2001 |
| JP | 2002026256 | A | 1/2002 |
| JP | 2002158339 | A | 5/2002 |
| JP | 2005057103 | A | 3/2005 |
| JP | 2005142322 | A | 6/2005 |
| JP | 2005322925 | A | 11/2005 |
| JP | 2008210955 | A | 9/2008 |
| JP | 2010021544 | A | 1/2010 |
| JP | 2011151370 | A | 8/2011 |
| JP | 2017518632 | A | 7/2017 |
| TW | 200718237 | A | 5/2007 |
| TW | 200919705 | A | 5/2009 |
| TW | 201227879 | A | 7/2012 |
| TW | 201725736 | A | 7/2017 |
| WO | 20130147295 | | 10/2013 |
| WO | 2015167887 | A1 | 11/2015 |
| WO | 2021112247 | A1 | 6/2021 |

OTHER PUBLICATIONS

1st Taiwan Office Action notified Mar. 3, 2022 for Taiwan Patent Application No. 110129115.
Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
Chandler, T. "An adaptive reference generation scheme for 1T1C FeRAMs", 2003 Symposium on VLSI Circuits. Digest of Technical Papers (IEEE Cat. No.03CH37408), Kyoto, Japan, 2003, pp. 173-174.
Du et al., "Microstructure and thermal stability of Ti1—xAlxN coatings deposited by reactive magnetron co-sputtering", Physics Procediavol. 18, 2011, pp. 222-226.
Final Office Action notified Apr. 25, 2022 for U.S. Appl. No. 16/287,953.
Final Office Action notified May 11, 2022 for U.S. Appl. No. 16/288,004.
Final Office Action notified May 11, 2022 for U.S. Appl. No. 16/288,006.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/066963.
International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.
Jung, D. et al., "Highly manufacturable 1T1C 4 Mb FRAM with novel sensing scheme," International Electron Devices Meeting 1999. Technical Digest (Cat. No. 99CH36318), Washington, DC, USA, 1999, pp. 279-282., International Electron Devices Meeting 1999. Technical Digest (Cat. No. 99CH36318), Washington, DC, USA, 1999, pp. 279-282.
Kim et al., "Anti-oxidation properties of TiAlN film prepared by plasma-assisted chemical vapor deposition and roles of Al", Thin Solid Filmsvol. 307, Issues 1-2, Oct. 10, 1997, pp. 113-119.
Koo et al., "Study on the characteristics of TiAlN thin film deposited by atomic layer deposition method", Journal of Vacuum Science & Technology A 19, 2831 (2001); https://doi.org/10.1116/1.1409375.
Leach, "Size and Texture Effects on Ferroelectrics", Purdue e-Pubs Open Access Dissertations Theses and Dissertations. Jan. 2014. 112 pages.
Man et al., "Microstructure, oxidation and H2-permeation resistance of TiAlN films deposited by DC magnetron Sputtering technique", Surface and Coatings Technology, vols. 180-181, Mar. 1, 2004, pp. 9-14.
Non-Final Office Action notified Aug. 5, 2020 for U.S. Appl. No. 16/287,953.
Non-Final Office Action notified Aug. 5, 2020 for U.S. Appl. No. 16/288,004.
Non-Final Office Action notified Aug. 5, 2020 for U.S. Appl. No. 16/288,006.
Non-Final Office Action notified Dec. 20, 2021 for U.S. Appl. No. 16/288,004.
Non-Final Office Action notified Jan. 18, 2022 for U.S. Appl. No. 16/287,953.
Non-Final Office Action notified Jan. 19, 2022 for U.S. Appl. No. 16/288,006.
Non-Final Office Action notified Jun. 26, 2020 for U.S. Appl. No. 16/287,876.
Non-Final Office Action notified Jun. 27, 2022 for U.S. Appl. No. 17/315,143.
Non-Final Office Action notified Sep. 2, 2022 for U.S. Appl. No. 17/315,139.
Non-Final Office Action notified Sep. 15, 2022 for U.S. Appl. No. 17/315,111.

(56) References Cited

OTHER PUBLICATIONS

Notice of Allowance notified Apr. 28, 2023 for U.S. Appl. No. 17/315,139.
Notice of Allowance notified Feb. 15, 2023 for U.S. Appl. No. 17/315,143.
Notice of Allowance notified Jan. 12, 2021 for U.S. Appl. No. 16/287,876.
Notice of Allowance notified Jan. 23, 2023 for U.S. Appl. No. 17/315,111.
Notice of Allowance notified Jul. 27, 2020 for U.S. Appl. No. 16/287,927.
Notice of Allowance notified Jun. 9, 2022 for U.S. Appl. No. 16/288,006.
Notice of Allowance notified Jun. 10, 2022 for U.S. Appl. No. 16/288,004.
Notice of Allowance notified Jun. 13, 2022 for U.S. Appl. No. 16/287,953.
Notice of Allowance notified Oct. 20, 2022 for Taiwan Patent Application No. 110129115.
Notice of Grant notified May 18, 2021 for Taiwan Patent Application No. 109106095.
Notice of Reasons for Rejection notified Dec. 6, 2022 for Japanese Patent Application No. 2021-546823.
Notice of Reasons for Rejection notified Nov. 22, 2022 for Japanese Patent Application No. 2021-546864.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Restriction Requirement notified Apr. 15, 2022 for U.S. Appl. No. 17/315,111.
Restriction Requirement notified Apr. 15, 2022 for U.S. Appl. No. 17/315,139.
Restriction Requirement notified Mar. 23, 2022 for U.S. Appl. No. 17/315,143.
Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.
Second Office Action notified Jul. 26, 2022 for Taiwan Patent Application No. 110129115.
Shim et al., "Process-property relationship in high-k ALD SrTiO3 and BaTiO3: a review", Journal of Materials Chemistry C. Issue 32, 2017. 8000-8013.
Shin et al., "Surface stability of epitaxial SrRuO3 films", Surface Sciencevol. 581, Issues 2-3, May 1, 2005, pp. 118-132.
Song et al., "Oxidation Behavior of TiAlN Barrier Layers with and without Thin Metal Overlayers for Memory Capacitor Applications", Journal of Materials Research, vol. 17 Issue 7Jul. 2002, pp. 1789-1794.
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Wu et al., "Multiferroic Bismuth Ferrite-based Materials for Multifunctional Applications: Ceramic Bulks, Thin Films and Nanostructures", Progress in Materials Science 84 (2016) 335-402(29)DOI:10.1016/j.pmatsci.2016.09.001.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.

* cited by examiner

700

NON-LINEAR POLAR MATERIAL BASED DEVICE WITH UNIFORM POLARIZATION

CLAIM FOR PRIORITY

This application is a continuation of, and claims the benefit of priority to U.S. patent application Ser. No. 17/315,139, filed on May 7, 2021, and now issued as U.S. Pat. No. 11,744,081 on Aug. 29, 2023, and which is a continuation of, and claims the benefit of priority to U.S. patent application Ser. No. 17/315,111, filed on May 7, 2021, and now issued as U.S. Pat. No. 11,659,714 on May 23, 2023, and which is incorporated by reference in entirety.

BACKGROUND

The standard memory used in processors is static random-access memory (SRAM) or dynamic random-access memory (DRAM), and their derivatives. These memories are volatile memories. For example, when power to the memories is turned off, the memories lose their stored data. Non-volatile memories are now also commonly used in computing platforms to replace magnetic hard disks. Non-volatile memories retain their stored data for prolonged periods (e.g., months, years, or forever) even when power to those memories is turned off. Examples of non-volatile memories are magnetic random-access memory (MRAM), NAND or NOR flash memories. These memories may not be suitable for low power and compact computing devices because these memories suffer from high write energy, low density, and high-power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
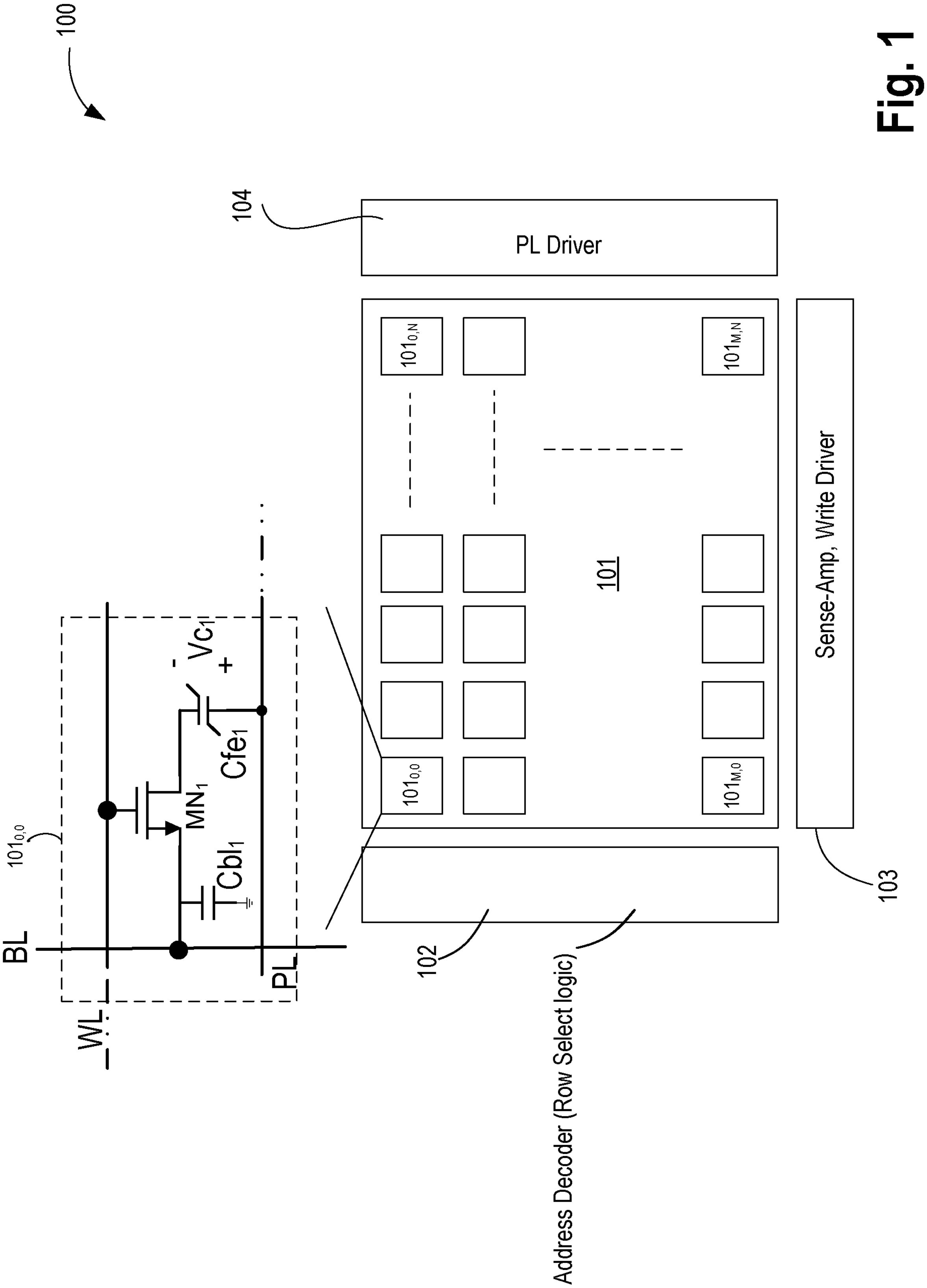
FIG. 1 illustrates an apparatus comprising memory and corresponding logic, wherein the memory comprises ferroelectric (FE) memory bit-cells with templating or texturing layer, in accordance with some embodiments.

Ferroelectric devices can be used as memory elements in integrated circuit (IC) semiconductor products or chips. Ferroelectricity is a phenomenon observed in certain types of crystals. The origin of the phenomenon is related to the lack of a center of symmetry within the crystal unit cell, which results in a permanent dipole moment. Specifically, in ferroelectrics, the direction of this dipole moment can be reversed by the application of electric fields. Thus, the performance of a ferroelectric device depends closely on the orientation of the crystal lattice of the ferroelectric. Certain crystallographic orientations are preferred to maximize device performance. Though ferroelectric films can be deposited epitaxially to have preferred orientations, in real world applications polycrystalline films are used widely due to the lack of a single crystal substrate (to seed epitaxial growth) at that point in the integrated process flow. Polycrystalline films have more randomly oriented crystal orientations compared to epitaxially deposited films, which leads to a large performance loss of the device.

Polycrystalline ferroelectric films are known to have a lower degree of effective polarization (polarization is a performance metric for these devices) compared to epitaxial films of similar chemical composition. The performance degradation with polycrystalline ferroelectric can be as much as 50%. This has prevented the existing or state-of-the-art ferroelectric devices from being scaled to smaller cell dimensions to become a serious contender for high-density high-performance non-volatile memory applications and a competitor to other Non-Volatile Memory (NVM) technologies such as three-dimensional (3D) NAND and 3D cross-point (X-point).

Some embodiments use a templating layer (also referred to as a texturing layer) deposited below the ferroelectric layer to enable the crystal lattice of the subsequently deposited ferroelectric layer to template off this templating layer and provide a large degree of preferential orientation of the crystal lattice despite the lack of epitaxial substrates. In some embodiments, a stack of layers that forms a ferroelectric device comprises a bottom barrier layer, a templating layer on the bottom barrier layer, a bottom electrode on the templating layer, a ferroelectric layer on the bottom electrode, a top electrode on the ferroelectric layer, and a top barrier on the top electrode. In some embodiments, each layer may be a single layer. In some embodiments, some or all layers comprise a superlattice of two or more different materials. For example, the bottom electrode, the templating layer, and the bottom barrier when combined or integrated may have a superlattice of two or more different materials. In some embodiments, the templating layer is self-crystallized. In some embodiments, the templating layer has an in-plane lattice constant. Note that all crystals have a lattice constant. The label "in-plane" here comes from epitaxial films, to distinguish the lattice constant in the plane of the film from the lattice constant out-of-plane of the film (the two may differ based on the crystal structure). In some embodiments, the in-plane lattice constant is within about 5% of a lattice constant of the bottom electrode and the ferroelectric layer. In some embodiments, the top and/or bottom electrodes includes one or more of: Sr, Ru, O, La, Mn, or Ti.

In some embodiments, the top and/or bottom barriers include one of: metal boride, metal carbide, metal nitride, and intermetallic or amorphous metal oxide. In some embodiments, metal boride includes one or more of: Ti, B, Ta, Co, B, Fe, Zr, Hf, or La. In some embodiments, metal boride includes one of: $TiB_2$, $TaB_2$, CoB, CoFeB, $ZrB_2$, $HfB_2$, or $LaB_6$. In some embodiments, metal carbide includes one or more of Ti, C, W, and Ta. In some embodiments, metal carbide includes one of: TiC, WC, or TaC. In some embodiments, metal nitride includes one or more of: Ti, Ta, N, or W. In some embodiments, metal nitride includes one of: TiN, TaN, or WN. In some embodiments, amorphous metals include one or more of: Ti, Si, N, Al, Ta, Ir, O, or Ru. In some embodiments, amorphous metals include one of: TiSiN, TiAlN, TaN, IrO, RuO, or TiOx, where 'x' is a number or fraction. In some embodiments, intermetallic materials include one or more of: Ti, Al, Ir, Mn, Ta, or N. In some embodiments, intermetallic materials include one of: Ti3Al, IrMn, TiAl, or TaN.

The choice of material may depend on the configuration of the templating layer. For example, when templating layer is part of the bottom barrier to form an integrated layer then intermetallic may be used. In some embodiments, the top and/or bottom electrodes include one of: orthorhombic $SrRuO_3$ with lattice constant of about 3.93 angstroms (A); $La_{0.5}Sr_{0.5}CoO_3$ with lattice constant of about 3.83 angstroms; $La_{0.5}Mn_{0.5}CoO_3$ with lattice constant of about 3.88 angstroms; or La-doped $SrTiO_3$. In some embodiments, the ferroelectric material includes one or more of: Pb, La, Zr, Ti, Bi, Fe, Mg, N, Hf, or Zr. In some embodiments, the ferroelectric material includes one of: $Pb_xLa_{1-x}Zr$ or $TiO_3$; pseudo-cubic or rhombohedral $BiFeO_3$ with lattice constant of about 3.97 angstroms; pseudo-cubic or rhombohedral $La_xBi_{1-x}FeO_3$ with lattice constant of about 3.96 angstroms; tetragonal $BaTiO_3$ with lattice constant of about 4 A; relaxor ferroelectrics including lead magnesium niobite-lead titanate (PMN-PT); or ferroelectric $Hf_{0.5}Zr_{0.5}O_2$ (HZO). In some embodiments, the templating layer includes one or more of: Fe, Pt, Ir, Mn, Sr, Ru, O, Bi, Ca, or Cu. In some embodiments, the templating layer includes one of: FePt with lattice constant of about 3.86 angstroms; IrMn3 with lattice constant of about 3.78 angstroms; Sr2RuO4 with lattice constant of about 3.84 angstroms; or BiSrCaCuO with lattice constant of about 3.83 angstroms.

In some embodiments, the templating layer is integrated with the bottom electrode, where the integrated layer is directly adjacent to the ferroelectric layer. In one such embodiment, the integrated layer (the templating layer and bottom electrode) are combined into a single layer which includes one of: $Sr_2RuO_4$, $SrRuO_3$, $La_{0.7}Sr_{0.3}MnO_3$, or $La_{0.5}Sr_{0.5}CoO_3$. In some embodiments, the templating layer is integrated with the bottom electrode as well as a bottom barrier (e.g., an oxygen and hydrogen diffusion barrier) to form a three-in-one integrated layer. This integrated layer is directly adjacent and below the ferroelectric layer. In some embodiments, this three-in-one integrated layer comprises intermetallic composition. Examples of such intermetallic include Ni—Al types of intermetallic and Ti—Al types of intermetallic. In various embodiments, the ferroelectric device is formed over a substrate. The substrate can be a silicon substrate, an oxide (e.g., $SiO_2$), or a metal substrate (e.g., tungsten). In some embodiments, the substrate can have both oxide and metals exposed simultaneously, for example in the backend section of an integrated device flow, such that the ferroelectric layer is deposited on such a composite substrate.

There are many technical effects of various embodiments. For example, the use of templating layers in various configurations as described herein improve the performance of real-world ferroelectric device technology to be closer to high-performance epitaxial films, thus enabling high-density high-performance non-volatile memories and other types of devices or circuits based on ferroelectricity. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up, e.g., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates apparatus 100 comprising memory and corresponding logic, wherein the memory comprises ferroelectric (FE) memory bit-cells with templating layers, in accordance with some embodiments. Logic 102 comprises address decoders for selecting a row of bit-cells and/or a particular bit-cell from an M×N array, where M and N are integers of same or different values. Logic 103 comprises sense-amplifiers for reading the values from the selected bit-cell, while write drivers are used to write a particular value to a selected differential bit-cell. Here, a schematic of ferroelectric (FE) bit-cell $\mathbf{101}_{0,0}$ is illustrated. The same embodiments apply to other bit-cells of the M×N array. In some embodiments, each bit-cell can be a differential bit-cell.

In some embodiments, ferroelectric bit-cell $\mathbf{101}_{0,0}$ comprises a word-line (WL), a plate-line (PL), a bit-line (BL), an n-type transistor $MN_1$, and an FE capacitive structure $Cfe_1$. In some embodiments, the gate of transistor $MN_1$ is coupled to the WL. In some embodiments, a first terminal of the FE capacitive structure $Cfe_1$ is coupled to the PL while a second terminal of the FE capacitive structure $Cfe_1$ is coupled to source or drain terminals of the n-type transistor $MN_1$. In some embodiments, the BL is coupled to the source or drain terminal of the transistor $MN_1$. In some embodiments, a BL capacitor $CBl_1$ (a non-ferroelectric capacitor) is coupled to the source or drain terminal of the transistor $MN_1$ and to a reference node (e.g., ground) such that the FE capacitor $Cfe_1$ is not coupled to the same source or drain terminal.

Figure 3:
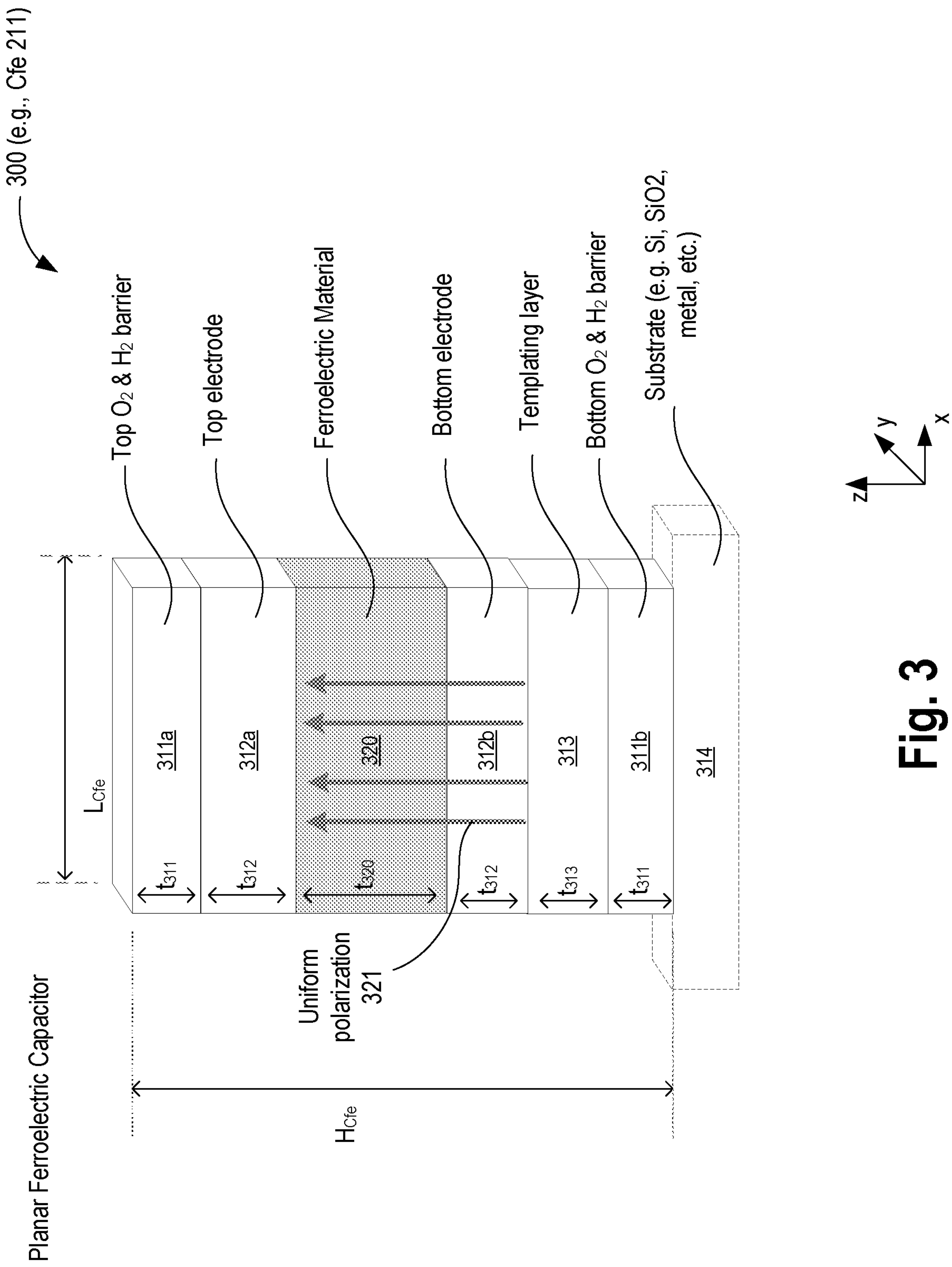
FIG. 3 illustrates a 3D view of the FE capacitive structure with templating or texturing layer, in accordance with some embodiments.
Figure 4:
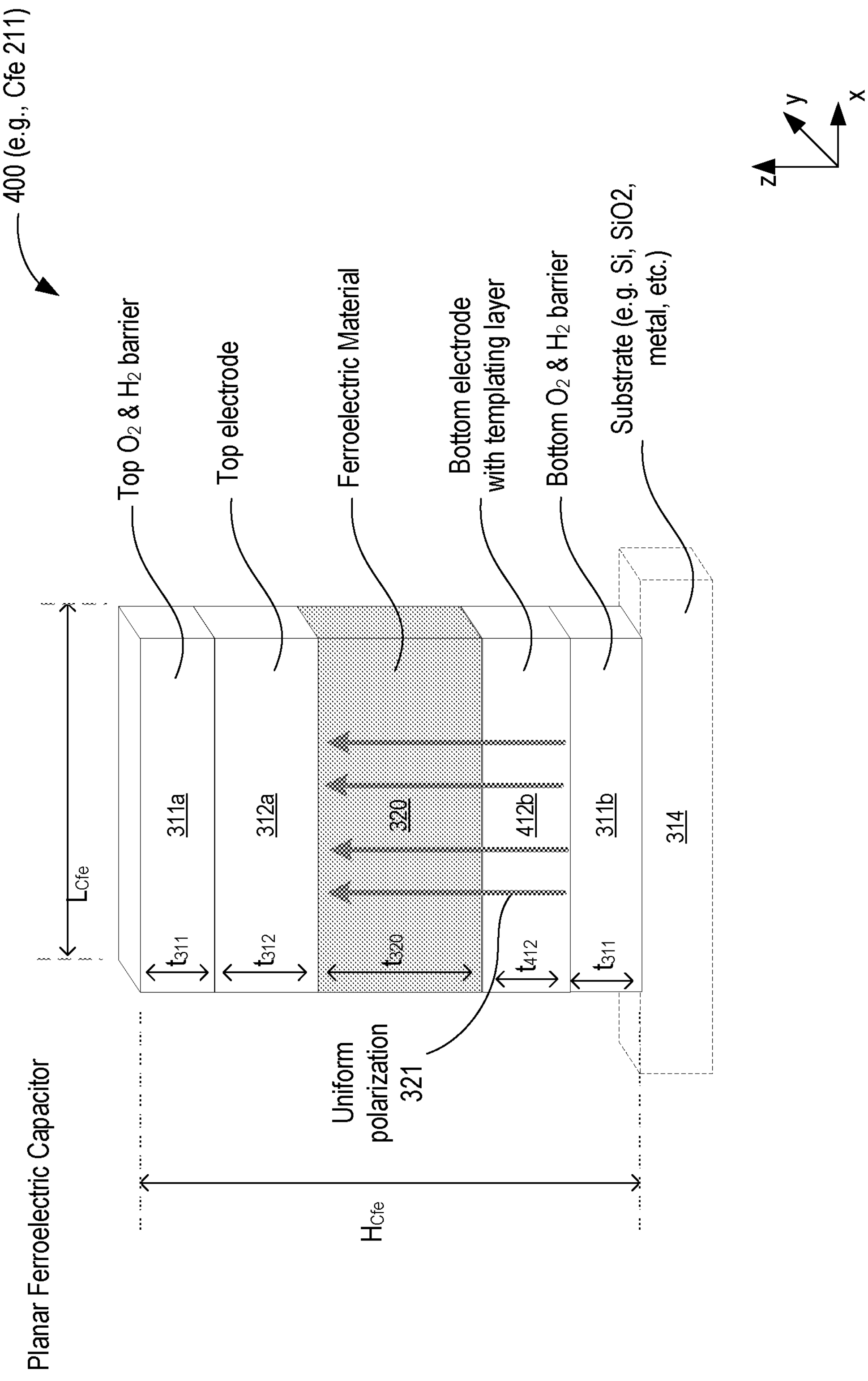
FIG. 4 illustrates a 3D view of the FE capacitive structure where a bottom electrode and a templating layer are integrated together, in accordance with some embodiments.
Figure 5:
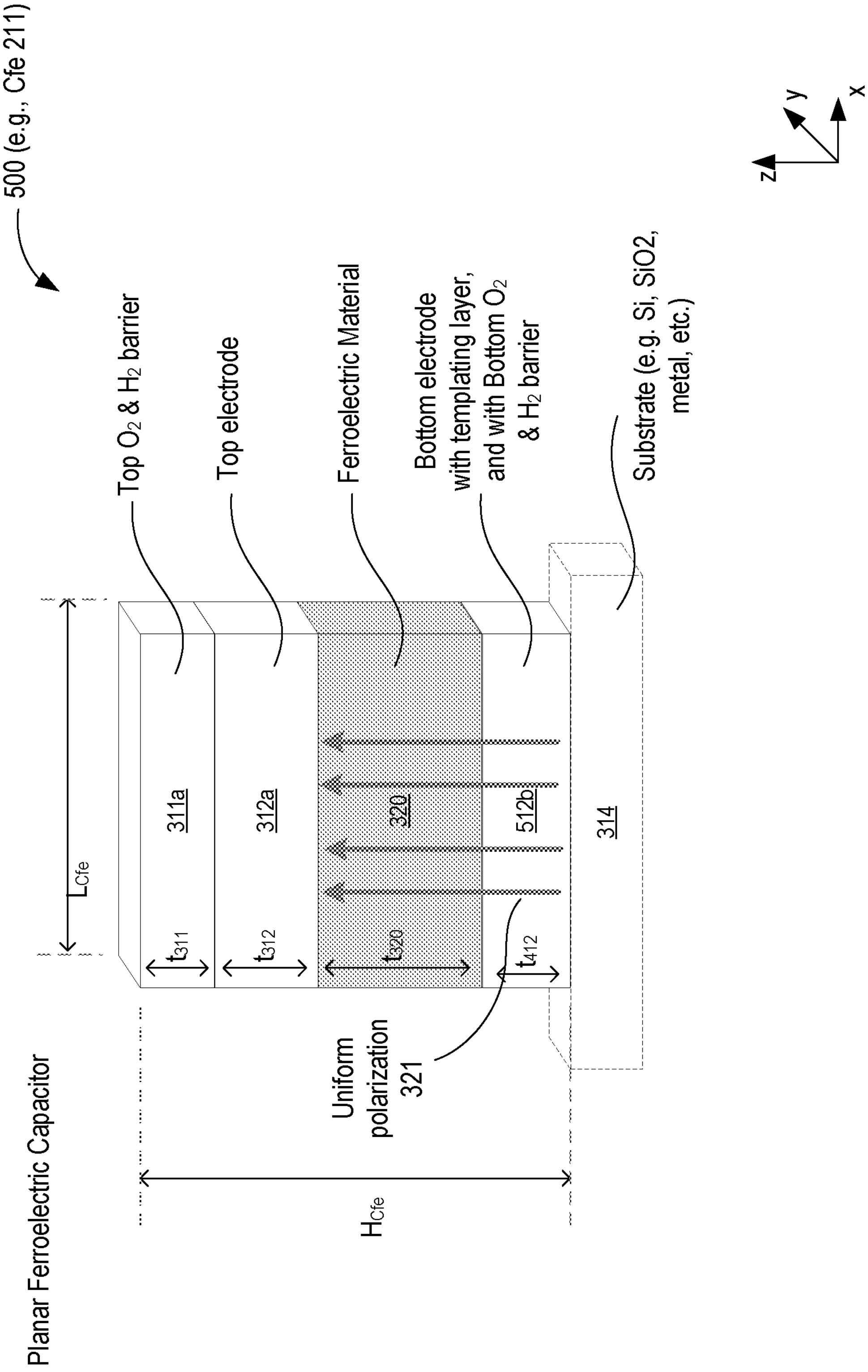
FIG. 5 illustrates a 3D view of the FE capacitive structure where a bottom electrode, a templating layer, and a barrier layer are integrated together, in accordance with some embodiments.

In some embodiments, the FE capacitor $Cfe_1$ comprises a stack of layers. FIGS. 3-5 illustrate various stack configurations. In various embodiments, the stack of layers includes a templating or texturing material. The templating or texturing material can be a single layer deposited below a ferroelectric layer to enable a crystal lattice of the subsequently deposited ferroelectric layer to template off this templating material and provide a large degree of preferential orientation despite the lack of epitaxial substrates. In some embodiments, the templating material is part of bottom electrode. In some embodiments, the templating material is part of a bottom electrode and a barrier layer.

Figure 2A:
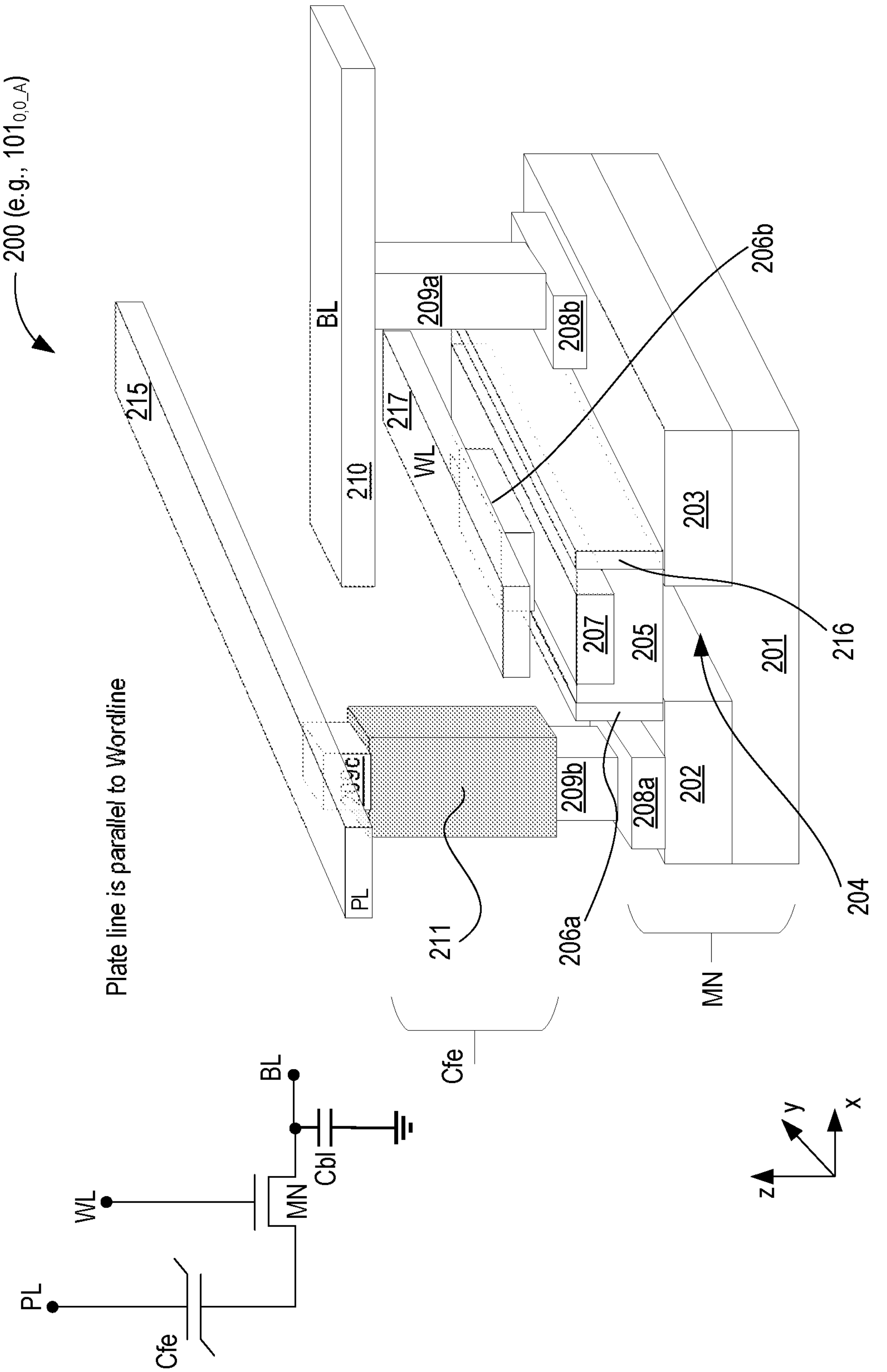
FIG. 2A illustrates a three-dimensional (3D) view of a bit-cell comprising a planar transistor and an FE capacitor with templating or texturing layer, in accordance with some embodiments.

FIG. 2A illustrates a three-dimensional (3D) view of a bit-cell 200 (e.g., $\mathbf{101}_{0,0}$) comprising a planar transistor and an FE capacitor with a templating layer, in accordance with some embodiments. The memory bit-cell includes a planar transistor MN having a substrate 201, a source 202, a drain 203, a channel region 204, a gate comprising gate dielectric 205, gate spacers 206*a* and 206*b*, a gate metal 207, a source contact 208*a*, and a drain contact 208*b*.

Substrate 201 includes a suitable semiconductor material such as: single crystal silicon, polycrystalline silicon, and silicon on insulator (SOI). In one embodiment, substrate 201 includes other semiconductor materials such as: Si, Ge, SiGe, or a suitable group III-V or group III-N compound. The substrate 201 may also include semiconductor materials, metals, dopants, and other materials commonly found in semiconductor substrates.

In some embodiments, source region 202 and drain region 203 are formed within substrate 201 adjacent to the gate stack of the transistor. The source region 202 and drain region 203 are generally formed using either an etching or deposition process or an implantation/diffusion process.

In the etching or deposition process, substrate 201 may first be etched to form recesses at the locations of the source 202 and drain 203 regions. An epitaxial deposition process may then be carried out to fill the recesses with material that is used to fabricate the source region 202 and drain region 203. In the implantation or diffusion process, dopants such as boron, aluminum, antimony, phosphorous, or arsenic may be ion-implanted into the substrate to form the source region 202 and drain region 203. An annealing process that activates the dopants and causes them to diffuse further into substrate 201 typically follows the ion-implantation process.

In some embodiments, one or more layers of metal and/or metal alloys are used to form the source region 202 and drain region 203. In some embodiments, source region 202 and drain region 203 are formed using one or more alternate semiconductor materials such as germanium or a suitable group III-V compound. In some embodiments, source region 202 and drain region 203 are fabricated using a silicon alloy such as silicon germanium or silicon carbide. In some embodiments, the epitaxially deposited silicon alloy is doped in-situ with dopants such as boron, arsenic, or phosphorous.

The semiconductor material for channel region 204 may have the same material as substrate 201, in accordance with some embodiments. In some embodiments, channel region 204 includes one of: Si, SiGe, Ge, and GaAs.

In some embodiments, gate dielectric layer 205 may include one layer or a stack of layers. The one or more layers may include high-k dielectric material, silicon oxide, and/or silicon dioxide ($SiO_2$). The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric layer 205 to improve its quality.

In some embodiments, a pair of spacer layers (sidewall spacers) 206*a/b* are formed on opposing sides of the gate stack that bracket the gate stack. The pair of spacer layers 206*a/b* are formed from a material such as: silicon oxynitride, silicon nitride, silicon nitride doped with carbon, or silicon carbide. Processes for forming sidewall spacers are well-known in the art and generally include deposition and etching process operations. In some embodiments, a plurality of spacer pairs may be used. For example, two pairs, three pairs, or four pairs of sidewall spacers may be formed on opposing sides of the gate stack.

Gate metal layer 207 may comprise at least one P-type work-function metal or N-type work-function metal, depending on whether the transistor is to be a p-type or an n-type transistor. Gate metal layer 207 may comprise a stack of two or more metal layers, where one or more metal layers are work-function metal layers and at least one metal layer is a conductive fill layer.

For an n-type transistor, metals that may be used for the gate metal layer 207 include: aluminum carbide, tantalum carbide, zirconium carbide, and hafnium carbide. In some embodiments, metal for gate metal layer 207 for n-type transistors include: aluminum, hafnium, zirconium, titanium, tantalum, and their alloys. An n-type metal layer will enable the formation of an n-type gate metal layer 207 with a work function that is between about 3.9 eV and about 4.2 eV. In some embodiments, metal of layer 207 includes one of: TiN, TiSiN, TaN, Cu, Al, Au, W, TiSiN, or Co. In some embodiments, metal of layer 107 includes one or more of: Ti, N, Si, Ta, Cu, Al, Au, W, or Co.

For a p-type transistor, metals that are used for gate metal layer 207 include, but are not limited to, ruthenium, palladium, platinum, cobalt, nickel, and conductive metal oxides. An example of conductive oxide includes ruthenium oxide. A p-type metal layer will enable the formation of a p-type gate metal layer 207 with a work function that is between about 4.9 eV and about 5.2 eV.

The drain contact 208*b* is coupled to via 209*b*, which is coupled to metal layer 110. Metal layer 210 is the bit-line, which extends along the x-axis. The source contact 208*a* is coupled to via 209*b*. Any suitable material can be used for drain and source contacts 208*a/n* and via 209*a/b*. For example, one or more of Ti, N, Si, Ta, Cu, Al, Au, W, or Co can be used for drain and source contacts 208*a/n* and via 209*a/b*. Via 209*b* is coupled to FE capacitor Cfe 211 that comprises a stack of layers including a templating layer deposited below a ferroelectric layer to enable crystal lattice of the subsequently deposited ferroelectric layer to template off this templating layer and provide a large degree of preferential orientation despite the lack of epitaxial substrates. In some embodiments, the stack of layers that forms a ferroelectric device or capacitor Cfe 211 comprises a bottom barrier layer, a templating layer on the bottom barrier layer, a bottom electrode on the templating layer, a ferroelectric layer on the bottom electrode, a top electrode on the ferroelectric layer, and a top barrier on the top electrode. In some embodiments, each layer may be a single layer. In some embodiments, some or all layers comprise a superlattice of two or more different materials. In some embodiments, the templating layer is self-crystalized. In some embodiments, the templating layer has an in-plane lattice constant. In some embodiments, the in-plane lattice constant is within about 5% of a lattice constant of the bottom electrode and the ferroelectric layer. In some embodiments, the top and/or bottom electrodes includes one or more of: Sr, Ru, O, La, Mn, or Ti.

In some embodiments, the top and/or bottom barriers include one of: metal boride, or metal carbide; metal nitride; intermetallic; or amorphous metal oxide. The choice of material may depend on the configuration of the templating layer. For example, when templating layer is part of the bottom barrier to form an integrated layer then intermetallic may be used. In some embodiments, the top and/or bottom electrodes include one of: orthorhombic $SrRuO_3$ with lattice constant of about 3.93 angstroms (A); $La_{0.5}Sr_{0.5}CoO_3$ with lattice constant of about 3.83 angstroms; $La_{0.5}Mn_{0.5}CoO_3$ with lattice constant of about 3.88 angstroms; or La-doped $SrTiO_3$. In some embodiments, the ferroelectric material includes one or more of: Pb, La, Zr, Ti, Bi, Fe, Mg, N, Hf, or Zr. In some embodiments, the ferroelectric material includes one of: $Pb_xLa_{1-x}Zr$ or $TiO_3$; pseudo-cubic or rhombohedral $BiFeO_3$ with lattice constant of about 3.97 angstroms; pseudo-cubic or rhombohedral $La_xBi_{1-x}FeO_3$ with lattice constant of about 3.96 angstroms; tetragonal $BaTiO_3$ with lattice constant of about 4 angstromes; relaxor ferroelectrics including lead magnesium niobite-lead titanate (PMN-PT); or ferroelectric $Hf_{0.5}Zr_{0.5}O_2$ (HZO). In some embodiments, the templating layer includes one or more of: Fe, Pt, Ir, Mn, Sr, Ru, O, Bi, Ca, or Cu. In some embodiments, the templating layer includes one of: FePt with lattice constant of about 3.86 angstroms; IrMn3 with lattice constant of about 3.78 angstroms; $Sr_2RuO_4$ with lattice constant of about 3.84 angstroms; or BiSrCaCuO with lattice constant of about 3.83 angstroms.

In some embodiments, the templating layer is integrated with the bottom electrode, where the integrated layer is directly adjacent to the ferroelectric layer. In one such embodiment, the integrated layer (the templating layer and bottom electrode) combined into a single layer includes one of: $Sr_2RuO_4$, $SrRuO_3$, $La_{0.7}Sr_{0.3}MnO_3$, or $La_{0.5}Sr_{0.5}CoO_3$. In some embodiments, the templating layer is integrated with the bottom electrode as well as a bottom barrier (e.g., an oxygen and hydrogen barrier), wherein the integrated layer is directly adjacent and below the ferroelectric layer. In some embodiments, the templating layer is integrated with the bottom electrode as well as a bottom barrier (e.g., an oxygen and hydrogen diffusion barrier) to form a three-in-one integrated layer. This integrated layer is directly adjacent and below the ferroelectric layer. In some embodiments, this three-in-one integrated layer comprises intermetallic composition. Examples of such intermetallic include Ni—Al types of intermetallic and Ti—Al types of intermetallic.

In some embodiments, ferroelectric device 211 is formed over a substrate. The substrate can be a silicon substrate, and oxide (e.g., $SiO_2$), or a metal substrate (e.g., tungsten). In some embodiments, the substrate can have both oxide and metals exposed simultaneously, for example, in the backend section of an integrated device flow, such that the ferroelectric layer is deposited on such a composite substrate. In this example, ferroelectric device 211 is fabricated over via (or metal pedestal) 209*b*. Metal pedestal 209*b* may include any suitable metal such tungsten, copper, aluminum, gold, silver, cobalt, iron, tantalum nitride, titanium nitride, or a combination of them. The top section of ferroelectric device 211 is coupled to PL 215. In some embodiments, the top section of ferroelectric device 211 is directly connected to PL 215. In some embodiments, the top section of ferroelectric device 211 is coupled to PL 215 via a via 209*c*. While various embodiments here are described with reference to a ferroelectric material for storing the charge state, the embodiments are also applicable for paraelectric material. While ferroelectric device 211 of various embodiments is shown as a rectangular structure, it can have other shapes too. For example, ferroelectric device 211 of various embodiments can have a cylindrical shape with dimensions similar to the rectangular capacitive structure.

In some embodiments, PL extends along the x-direction and parallel to the BL 210. (Note, this particular orientation is not shown.) Having the BL and the PL parallel to one another further improves the density of the memory because the memory bit-cell footprint reduces compared to the case when BL and PL are orthogonal to each other. In some embodiments, PL 215 extends along the y-axis and is parallel to word-line (WL) 217. In one such embodiment, PL 215 is orthogonal to BL 210. Depending on the floorplan for memory 101, one of the orientations of PL 215 relative to BL 210 and/or WL 217 can reduce overall size of memory 101. In some embodiments, ferroelectric device 211 is positioned above bit-line 210. Such an example allows for using the space between BL 210 and PL 215 for forming ferroelectric device 211.

In some embodiments, gate metal 207 is coupled to gate contact 216, which is coupled to metal line 217. Metal line 217 is used as the word-line (WL). In some embodiments, WL 217 extends orthogonally to BL 210 and PL 215. In some embodiments, WL 217 is also parallel to BL 210 and PL 215. Any suitable metal can be used for BL 210, PL 215, and WL 217. For example, W, Al, Cu, Co, Au, or Ag can be used for BL 210, PL 215, and WL 217.

Figure 2B:
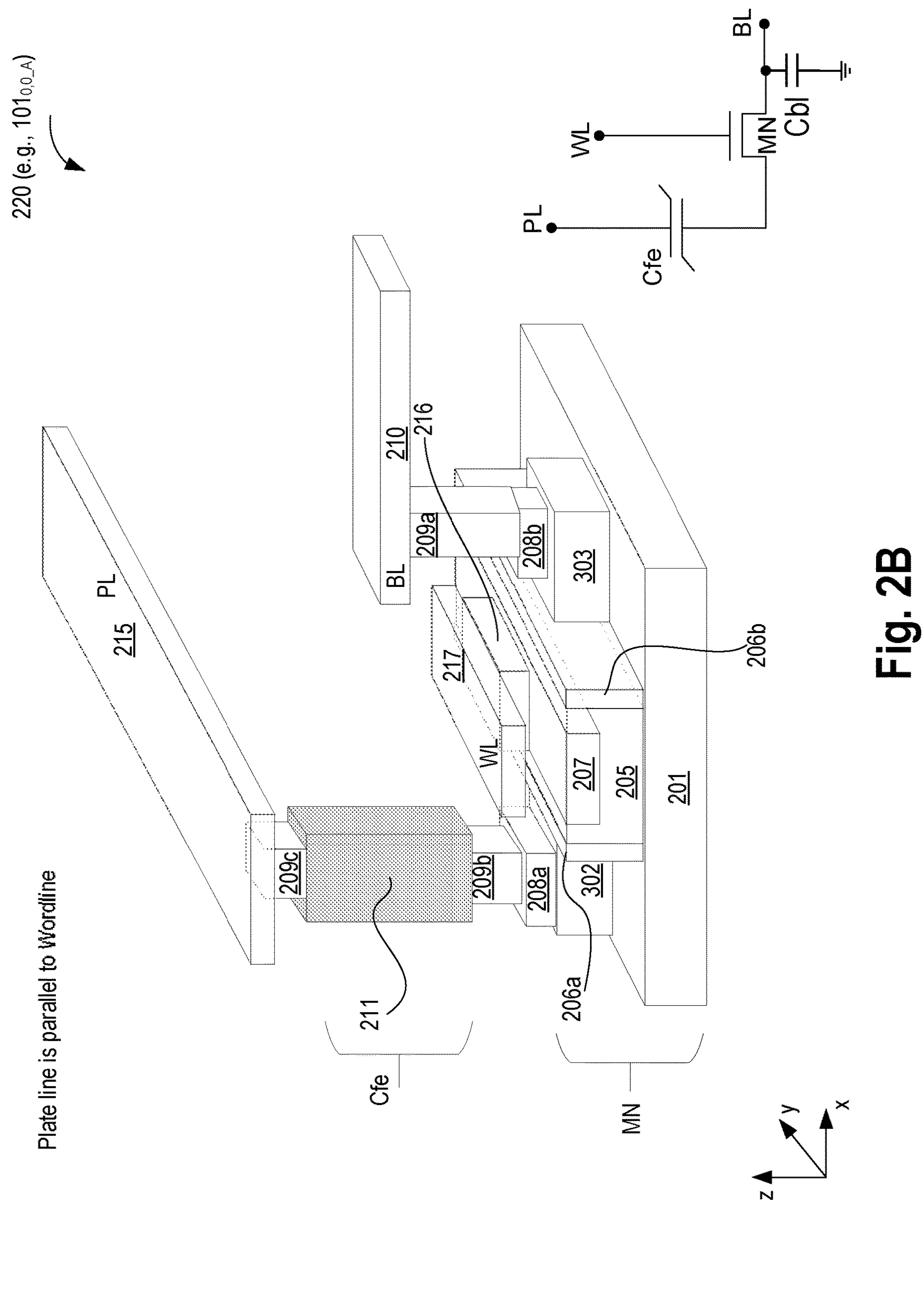
FIG. 2B illustrates a 3D view of a bit-cell comprising a non-planar transistor and an FE capacitor with templating or texturing layer, in accordance with some embodiments.

FIG. 2B illustrates a 3D view of a bit-cell 220 comprising a non-planar transistor and an FE capacitor with a templating layer, in accordance with some embodiments. Memory bit-cell 220 of FIG. 2B is similar to memory bit-cell 200 of FIG. 2A but includes a non-planar transistor. FinFET or tri-gate transistor is an example of a non-planar transistor. FinFET comprises a fin that includes source 302 and drain 303 regions. A channel resides between the source and regions 302 and 303. The transistor MN can have multiple fins parallel to one another that are coupled to the same gate stack. The gates are perpendicular to the fins. The fins pass through the gate stack forming source and drain regions 302 and 303.

FIG. 3 illustrates a 3D view of FE capacitive structure 300 (e.g., 211) comprising a templating layer, in accordance with some embodiments. FE capacitive structure 300 includes a stack of layers. The layers in the stack from top to bottom in this embodiment are top barrier layer 311*a* (e.g., $O_2$ and $H_2$ diffusion barriers), top electrode 312*a*, ferroelectric material 320, bottom electrode 312*b*, templating or texturing layer 313, and bottom barrier 311*b* (e.g., $O_2$ and $H_2$ diffusion barrier). In this embodiment, bottom electrode 312*b* is deposited on templating layer 313, and ferroelectric layer 320 is deposited on bottom electrode 312*b*. In this example, bottom $O_2$ and $H_2$ diffusion barrier layer 311*b* is below templating layer 313.

In various embodiments, templating layer 313 is deposited below ferroelectric layer 320 to enable crystal lattice of the subsequently deposited ferroelectric layer 320 to template off this templating layer and provide a large degree of preferential orientation despite the lack of epitaxial substrates. Orientation 321 shows uniform polarization in ferroelectric layer 320 and material of bottom electrode 312*b* due to templating layer 313.

In some embodiments, each layer in the stack may be a single layer. In some embodiments, some or all layers comprise a superlattice of two or more different materials. In some embodiments, templating layer 313 is self-crystalized. For example, templating layer 313 is configured to self-crystallize into a preferred orientation when deposited on bottom $O_2$ and $H_2$ barrier layer 311*b* within a thermal budget available in the integrated flow. Templating layer 313 may not need a seed to form a preferred crystalline orientation because it self-crystalizes. Typical thermal budgets in the integrated process flows range from 400 degrees Celsius (C) for logic device flows to 600-650° C. in dynamic random-access memory (DRAM) flows to approximately 750° C. for NAND memory flows.

In some embodiments, templating layer 313 has an in-plane lattice constant. Note, all crystals have a lattice constant. The label "in-plane" comes from epitaxial films, to distinguish the lattice constant in the plane of the film from the lattice constant out-of-plane of the film (the two may differ based on the crystal structure). In some embodiments, the in-plane lattice constant is within about 5% (e.g., less than approximately 5%) of a lattice constant of bottom electrode 312*b* and ferroelectric layer 320 when in a desired orientation. In one example, if the lattice constant difference between that of templating layer 313 and bottom electrode 312*b* and ferroelectric layer 320 is too large (e.g., greater than 7%) then the chances of the template being effective may be reduced. In some embodiments, templating layer 313 includes one or more of: Fe, Pt, Ir, Mn, Sr, Ru, O, Bi, Ca, or Cu. In some embodiments, templating layer 313 includes one of: FePt with lattice constant of about 3.86 angstroms; IrMn3 with lattice constant of about 3.78 angstroms; $Sr_2RuO_4$ with lattice constant of about 3.84 angstroms; or BiSrCaCuO with lattice constant of about 3.83 angstroms. In some embodiments, top and/or bottom electrodes 312*a* and 312*b*, respectively, includes one or more of: Sr, Ru, O, La, Mn, or Ti. In some embodiments, top and/or bottom electrodes 312*a* and 312*b* include one of: orthorhombic $SrRuO_3$ with lattice constant of about 3.93 aAngstroms; $La_{0.5}Sr_{0.5}CoO_3$ with lattice constant of about 3.83 angstroms; $La_{0.5}Mn_{0.5}CoO_3$ with lattice constant of about 3.88 angstroms; or La-doped $SrTiO_3$.

In some embodiments, templating layer 313 is configured (e.g., by selection of material and fabrication) such that it may not lose crystalline texture when exposed to $O_2$ (and/or $H_2$). Most ferroelectric materials of commercial interest are oxides, and some electrodes of commercial interest are also oxides. Thus, deposition of the bottom electrode and the ferroelectric layer will expose the templating layer to heavy $O_2$ flux. As such, in various embodiments, templating layer 313 is configured to remain insensitive to $O_2$ flux to the extent that its crystallographic orientation is preserved.

In some embodiments, templating layer 313 is configured (e.g., by selection of material and fabrication) to be electrically conductive even after deposition of subsequent layers that may be exposed to $O_2$ flux. One reason for templating layer 313 being conductive is that a ferroelectric device is essentially a capacitor and high access resistance to the ferroelectric capacitor may be detrimental to device performance.

In some embodiments, bottom electrode 312*b* has an in-plane lattice constant close to the lattice constant of ferroelectric layer 320 and templating layer 313. Having such close lattice constant allows for the crystallographic orientation of templating layer 313 to be transferred effectively to ferroelectric layer 320. In some embodiments, top and/or bottom barriers 311*a* and 311*b*, respectively, include one of: metal boride and metal carbide; metal nitride; intermetallic; or amorphous metal oxide. In some embodiments, the top and/or bottom barriers include one of: metal boride and metal carbide; metal nitride; intermetallic; or amorphous metal oxide. In some embodiments, metal boride includes one or more of: Ti, B, Ta, Co, B, Fe, Zr, Hf, or La. In some embodiments, metal boride includes one of: $TiB_2$, $TaB_2$, CoB, CoFeB, $ZrB_2$, $HfB_2$, or $LaB_6$. In some embodiments, metal carbide includes one or more of Ti, C, W, and Ta. In some embodiments, metal carbide includes one of: TiC, WC, or TaC. In some embodiments, metal nitride includes one or more of: Ti, Ta, N, or W. In some embodiments, metal nitride includes one of: TiN, TaN, or WN. In some embodiments, amorphous metals include one or more of: Ti, Si, N, Al, Ta, Ir, O, or Ru. In some embodiments, amorphous metals include one of: TiSiN, TiAlN, TaN, IrO, RuO, or TiOx, where 'x' is a number or fraction. In some embodiments, intermetallic materials include one or more of: Ti, Al, Ir, Mn, Ta, or N. In some embodiments, intermetallic materials include one of: Ti3Al, IrMn, TiAl, or TaN.

In some embodiments, the ferroelectric material of ferroelectric layer 320 includes one or more of: Pb, La, Zr, Ti, Bi, Fe, Mg, N, Hf, or Zr. In some embodiments, the ferroelectric material of ferroelectric layer 320 includes one of: $Pb_xLa_{1-x}Zr$ or $TiO_3$; pseudo-cubic $BiFeO_3$ with lattice constant of about 3.97 angstroms; pseudo-cubic $La_xBi_{1-x}FeO_3$ with lattice constant of about 3.96 angstroms; tetragonal $BaTiO_3$ with lattice constant of about 4 angstroms; relaxor ferroelectrics including lead magnesium niobite-lead titanate (PMN-PT); or ferroelectric $Hf_{0.5}Zr_{0.5}O_2$ (HZO).

In various embodiments, the thickness of each layer (e.g., $t_{311}$, $t_{312}$, $t_{313}$, $t_{230}$) is in a range of 5 nm to 30 nm. In various embodiments, the total height $H_{CFe}$ of ferroelectric device 300 is in a range of 30 nm to 180 nm. In some embodiments, the lateral thickness $L_{CFe}$ of ferroelectric device 300 is in a range of 5 nm to 200 nm. In some embodiments, the thickness of each layer can be in a range of approximately 1 nm to 100 nm. The total height Hcre of ferroelectric device 300 would thus be in a range of about 6 nm to 600 nm. In some embodiments, ferroelectric device 300 is formed on top of substrate 314. Substrate 314 can be any suitable substrate such as Si substrate, $SiO_2$ substrate, metal substrate (e.g., W, Ag, Au, Co, Cu, Fe, Al, or a combination of them). In some embodiments, substrate 314 can have both oxide and metals exposed simultaneously, for example in the backend section of an integrated device flow, such that the ferroelectric layer is deposited on such a composite substrate.

FIG. 4 illustrates a 3D view of FE capacitive structure 400 (e.g., Cfe 211) where a bottom electrode and a templating layer are integrated together, in accordance with some embodiments. Compared to FE capacitive structure 300, templating layer 313 and bottom electrode 312*b* are combined or integrated into a single layer 412*b*. In some embodiments, integrated layer 412*b* is a super lattice of two or more materials. The two materials for the super lattice may include a first material of $Sr_2RuO_4$ (or any of the listed materials for the template layer) and a second material of $SrRuO_3$ (or any of the listed materials for the metallic electrode). In some embodiments, this single or integrated layer 412*b* includes one or more of Sr, Ru, O, La, Mn, or Co. In some embodiments, single or integrated layer 412*b* includes one of: $Sr_2RuO_4$, $SrRuO_3$, $La_{0.7}Sr_{0.3}MnO_3$, or $La_{0.5}Sr_{0.5}CoO_3$. In various embodiments, integrated layer 412*b* displays the characteristics of templating layer 313 described with reference to FIG. 3. In addition to those characteristics of templating layer 313, integrated layer 412*b* acts as a good electrode for FE-layer 320. For example, integrated layer 412*b* has minimum possible electrical resistivity, and has no reaction or interdiffusion with FE material of ferroelectric layer 320 even after endurance cycling and thermal stress in typical usage conditions. In various embodiments, integrated layer 412*b* is configured (by selection of material and/or fabrication) to have minimum possible contact or interfacial resistance with FE layer 320. In some embodiments, integrated layer 412*b* is configured (by selection of material and/or fabrication) to have no degradation of electrode material itself with endurance cycling and thermal stress in typical usage conditions. In various embodiments, the thickness of each layer (e.g., $t_{311}$, $t_{312}$, $t_{412}$, $t_{230}$) is in a range of 5 nm to 30 nm. In various embodiments, the total height $H_{CFe}$ of ferroelectric device 400 is in a range of 25 nm to 150 nm. In some embodiments, the thickness of each layer can be in a range of approximately 1 nm to 100 nm. The total height $H_{CFe}$ of ferroelectric device 400 and thus be in a range of about 5 nm to 500 nm.

FIG. 5 illustrates a 3D view of FE capacitive structure 500 where a bottom electrode, a templating layer, and a barrier layer are integrated together, in accordance with some embodiments. Compared to FE capacitive structure 300, templating layer 313, bottom electrode 312*b*, and bottom diffusion barrier 311*b* are combined or integrated into a single layer 512*b*. In some embodiments, integrated layer 512*b* is a super lattice or two or more materials. In some embodiments, this single or integrated layer 512*b* include intermetallic material with in-plane lattice constant of less than 5% to the lattice constant of the FE material of FE layer 320. The materials for the super lattice may include a first material of $Sr_2RuO_4$ (or any of the listed materials for the template layer) a second material of $SrRuO_3$ (or any of the listed materials for the metallic electrode), and a third material which is an intermetallic (or any of the listed barrier materials). The materials of the super lattice of various embodiments may be repeated any number of times.

In some embodiments, intermetallic material includes material of type Ti and Al such as $Ti_3Al$, TiAl, and $TiAl_3$. In some embodiments, intermetallic material includes material of type Ni and Al such as Ni—Al, $Ni_3Al$, and $NiAl_3$. In some embodiments, intermetallic material includes material of type Ni and Ti such as Ni—Al: $Ni_3Ti$, and $NiTi_3$. In various embodiments, the thickness of each layer (e.g., $t_{311}$, $t_{312}$, $t_{512}$, $t_{230}$) is in a range of 5 nm to 30 nm. In various embodiments, the total height $H_{CFe}$ of ferroelectric device 500 is in a range of 20 nm to 120 nm. In some embodiments, the thickness of each layer can be in a range of approximately 1 nm to 100 nm. The total height $H_{CFe}$ of ferroelectric device 500 and thus be in a range of about 4 nm to 400 nm In various embodiments, the downstream integrated device flow may not subject ferroelectric layer 320 to temperatures that would result in the randomization of its preferred orientation obtained by means of templating layer 313 (or in other forms such as integrated layers 412 and 512). In some embodiments, the downstream process flow can actually be engineered to enhance the templating effect on ferroelectric layer 320.

Figure 6:
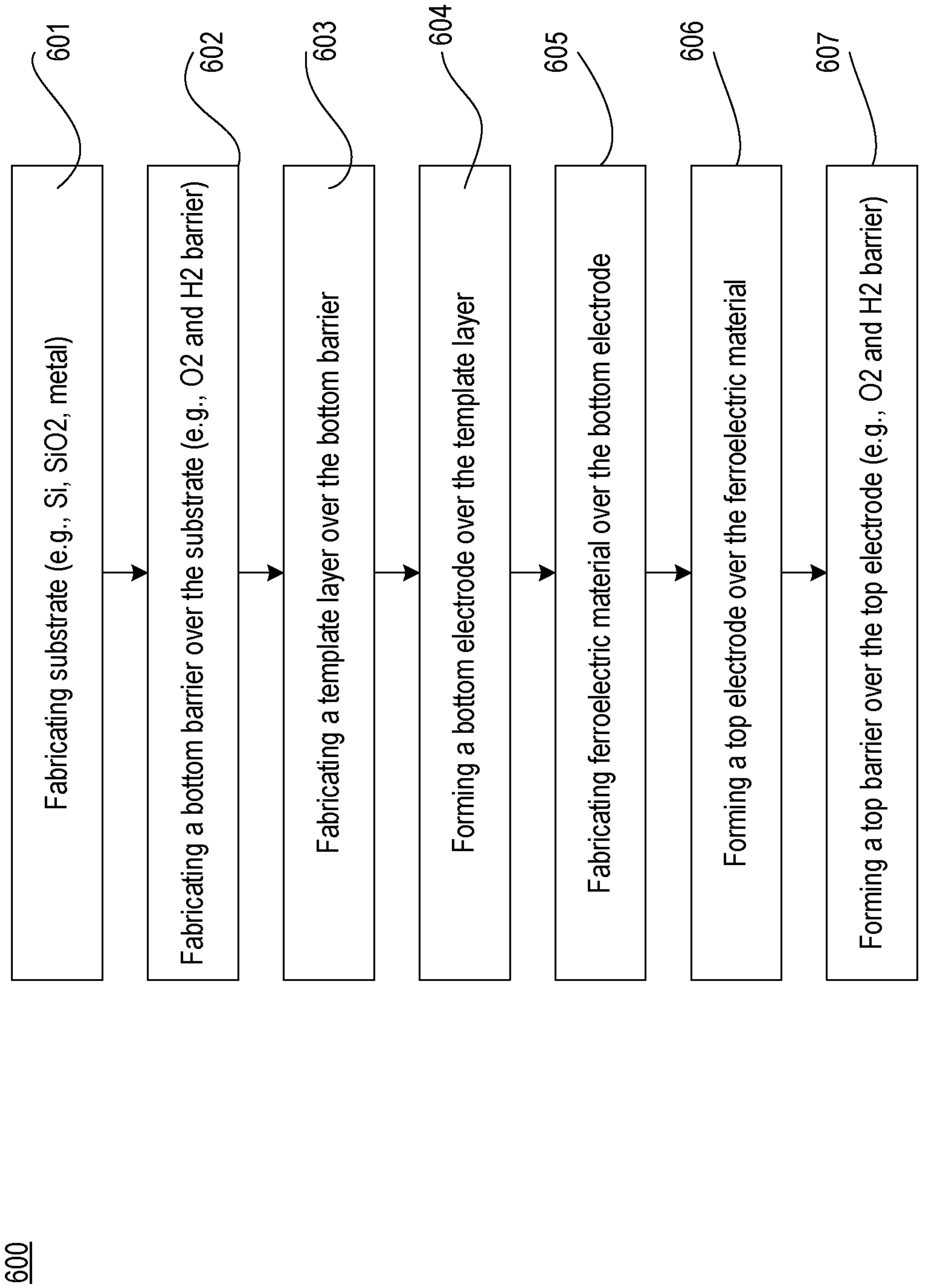
FIG. 6 illustrates a flowchart of a method for forming the FE capacitive structure of FIG. 3, in accordance with some embodiments.

FIG. 6 illustrates flowchart 600 for forming FE capacitive structure of FIG. 3, in accordance with some embodiments. At block 600, substrate 314 is fabricated or formed. In some embodiments, FE capacitive structure 300 is formed or deposited on a silicon substrate, an oxide substrate (e.g., $SiO_2$) or a metal substrate (e.g., any suitable metal used for conduction such as tungsten). As discussed herein, substrate 314 can have both oxide and metals exposed simultaneously, for example in the backend section of an integrated device flow, such that the ferroelectric layer is deposited on such a composite substrate.

The layers of FE capacitive structure 300 are then formed or deposited in a sequence as indicated by blocks 602, 603, 604, 605, 606, and 607. At block 602, bottom diffusion barrier 311*b* (e.g., TiAlN) is formed over any suitable substrate 314. At block 603, template layer 313 (e.g., $Sr_2RuO_4$ is formed or deposited over bottom diffusion barrier 311*b*. At block 604, bottom electrode 312*b* is formed over template layer 313. At block 605, ferroelectric material 320 (e.g., $LaBiFeO_3$) is formed or deposited over bottom electrode 312*b* (e.g., $LaSrMnO_3$). At block 606, top electrode 312*a* (e.g., $LaSrMnO_3$) is formed over ferroelectric material 320. At block 607, top diffusion barrier 311*a* (e.g., TiAlN) is formed over top electrode 312*a*.

Figure 7:
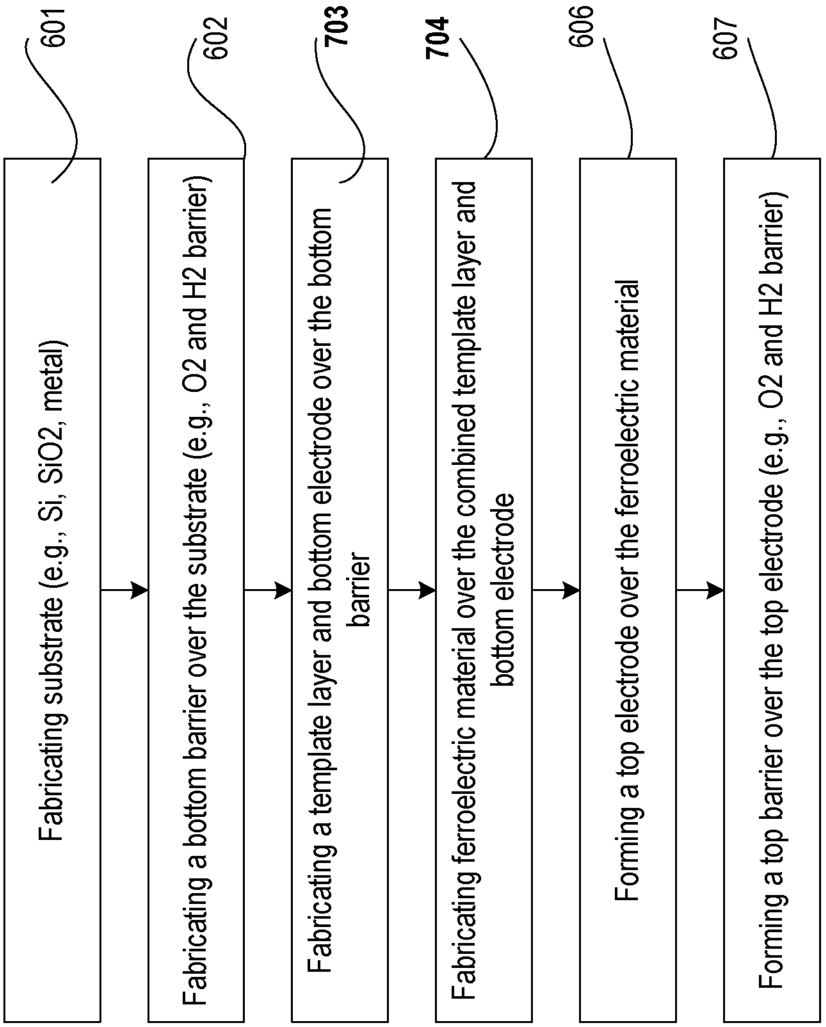
FIG. 7 illustrates a flowchart of a method for forming the FE capacitive structure of FIG. 4, in accordance with some embodiments.

FIG. 7 illustrates flowchart 700 for forming FE capacitive structure of FIG. 4, in accordance with some embodiments. Flowchart 700 is similar to flowchart 600. In some embodiments, after bottom diffusion barrier 311*b* (e.g., TiAlN) is formed or deposited over substrate 314 (e.g., tungsten), integrated layer 412 is deposited over bottom barrier 311*b* as indicated by block 703. Integrated layer 412 (e.g., $Sr_2RuO_4$) combines bottom electrode 312*b* and templating layer 314 in a single integrated layer. The integrated layer can be a super lattice of two or more materials. At block 704, ferroelectric material 320 (e.g., $LaBiFeO_3$) is formed or deposited over integrated layer 412. Thereafter, top electrode 312*a* (e.g., $Sr_2RuO_4$) and top diffusion barrier 311*a* (e.g., TiAlN) are formed or deposited at blocks 606 and 607, respectively.

Figure 8:
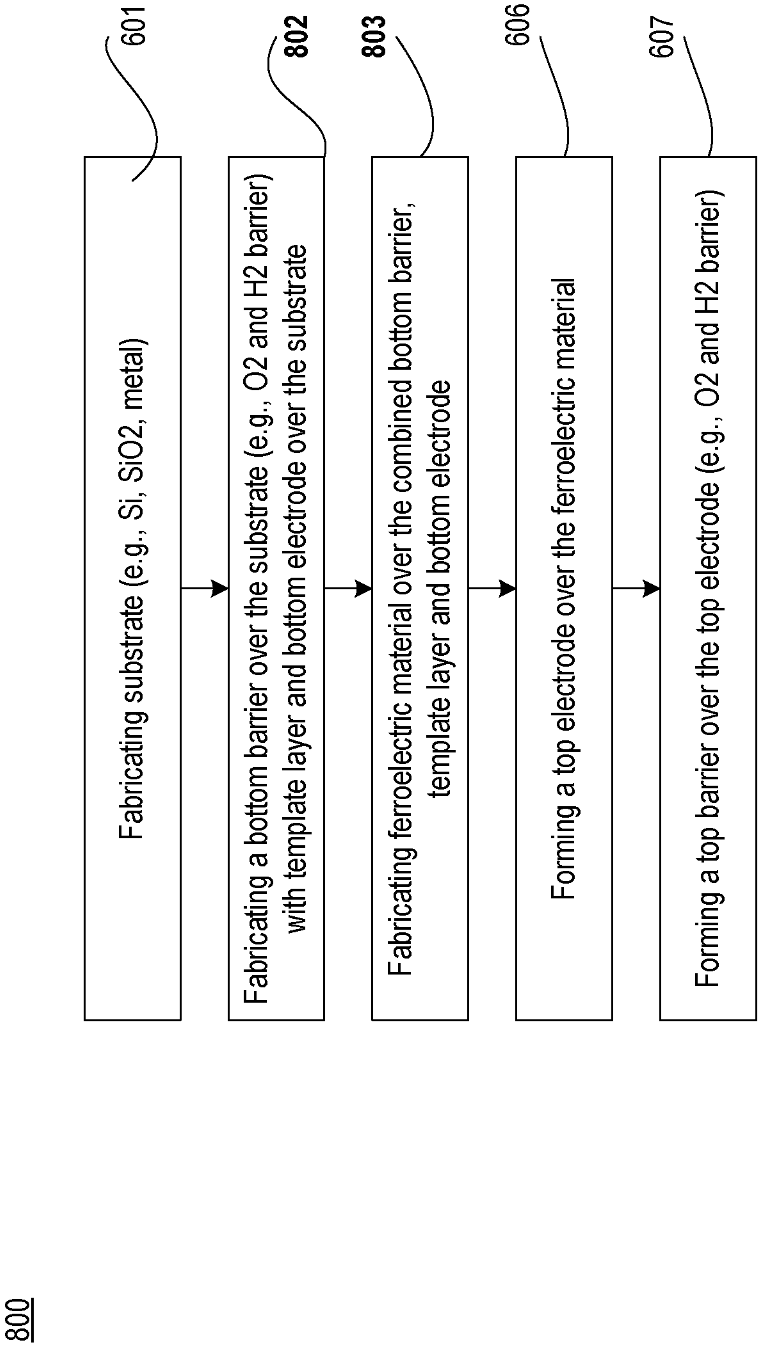
FIG. 8 illustrates a flowchart of a method for forming the FE capacitive structure of FIG. 5, in accordance with some embodiments.

FIG. 8 illustrates flowchart 800 for forming FE capacitive structure of the FIG. 5, in accordance with some embodiments. Flowchart 800 is similar to flowchart 600. In some embodiments, integrated layer 512 (e.g., iridium where approximately 2 nm is oxidized in-situ) is deposited over substrate 314 as indicated by block 802. Integrated layer 512 combines bottom electrode 312*b*, templating layer 314, and bottom diffusion barrier layer 311*a* in a single integrated layer. Integrated layer 512 can be a super lattice of two or more materials. At block 803, ferroelectric material 320 is formed or deposited over integrated layer 512. Thereafter top electrode 312*a* and top diffusion barrier 311*a* are formed or deposited at blocks 606 and 607, respectively.

Deposition of the materials or layers in various embodiments can be realized by physical vapor deposition methods such as D.C. Sputtering, Pulsed D.C. Sputtering, Reactive Sputtering, Radio Frequency (RF) Sputtering, Pulsed Laser Deposition, Ion Beam Deposition, and combinations thereof. Deposition can also be realized by means of chemical vapor deposition methods such as Thermal CVD, Plasma-enhanced CVD, Thermal Atomic Layer Deposition (ALD), Plasma-enhanced Atomic Layer Deposition. It is also possible to deposit different layers with different techniques.

In some embodiments, deposition of complex oxide materials via PVD is achieved from sputter targets of the same composition as the desired film composition. In some cases, excess amounts of volatile elements in the composition (e.g., Pb in PZT) is added to the target composition during target manufacturing to offset vaporization-induced loss of the volatile element during the deposition process. Alternately, co-sputtering is used. In this co-sputtering method, simultaneous sputtering from targets of the constituent sub-oxides is performed to realize a film that is of the desired composition on wafer (e.g., SrO and RuO targets can be co-sputtered to realize an SrRuO3 film on wafer). The principal process variables during PVD deposition are: a) plasma power density; b) $O_2$ partial pressure; c) total pressure; and d) substrate temperature. Typical range for power density is 5-50 watts per square inch, $O_2$ partial pressure is 1%-25%, total pressure 0.3 mTorr to greater than 30 mTorr for sputtering and greater than 150 mTorr for PLD. Substrate temperature controls the film stoichiometry and the grain size. In this regard the temperature range can be quite broad, from approximately 150° C. to greater than 750° C., depending on the specific material.

In some embodiments, deposition of complex oxides via CVD techniques is achieved by co-flowing metal organic precursors of each cation (e.g., bismuth precursor plus Fe precursor) along with the oxidizing precursor (e.g., $O_3$, $O_2$), in the right proportions at a given temperature, to achieve the desired stoichiometry in the film. The process variables therefore are the flow rates of precursors and the temperature. In this instance, temperature affects both the reactivity of precursors as well as the film crystallinity/morphology/grain size, along with the maximum temperature allowed by the thermal budget of the integrated flow. Therefore, a compromise temperature is used for film deposition, e.g., 400° C.-600° C. Total process pressure in CVD processes ranges from approximately 5 Torr to atmospheric pressure approximately 750 Torr.

In some embodiments, deposition of complex oxides by ALD techniques involve sequential pulsing of a cation precursor and the oxidizing co-reactant into the process chamber, interspersed by a purging step after each pulsing step; purging uses an inert gas like argon to remove unreacted precursor chemistry from the deposition chamber/environment. The ALD of multi-component oxides (e.g., $BiFeO_3$ is made of $Bi_2O_3$ and $Fe_2O_3$ binary oxides) typically involves layer-by-layer growth of the individual binary oxides, e.g., $Bi_2O_3$ layers and $Fe_2O_3$ layers, to form a macroscopic ternary/quaternary oxide film. Compositional uniformity at the nanometer scale is achieved by engineering the layer "pitch" to obtain each "supercycle" of ALD film. For example, 20 cycles of $Bi_2O_3$ plus 20 cycles of $Fe_2O_3$ will result in a 40 cycle supercycle recipe, and a less microscopically homogeneous film compared to a 10 cycle supercycle recipe where each supercycle consists of 5 cycles of $Bi_2O_3$ plus 5 cycles of $Fe_2O_3$. The temperature of deposition also influences not only the film crystallinity, morphology, and/or grain size, but also the nanoscale uniformity of composition. In some embodiments, ALD deposition temperatures can range from room temperature to 500 °C. In some embodiments, process pressure in ALD ranges from approx. 0.5 Torr to approx. 10 Torr. In this manner, a wide range of different films can be deposited using the same precursors.

In some embodiments, the deposition of metal (non-oxide) systems mentioned herein can also be achieved by PVD, CVD or ALD. In some embodiments, PVD is used to deposit metals and alloys. For example, DC Sputtering or DC Co-sputtering is used to deposit metals for various layers of the ferroelectric device. In some embodiments, intermetallic compounds like metal nitrides and metal carbides are deposited using Reactive Sputtering or Reactive Co-sputtering techniques.

Figure 9:
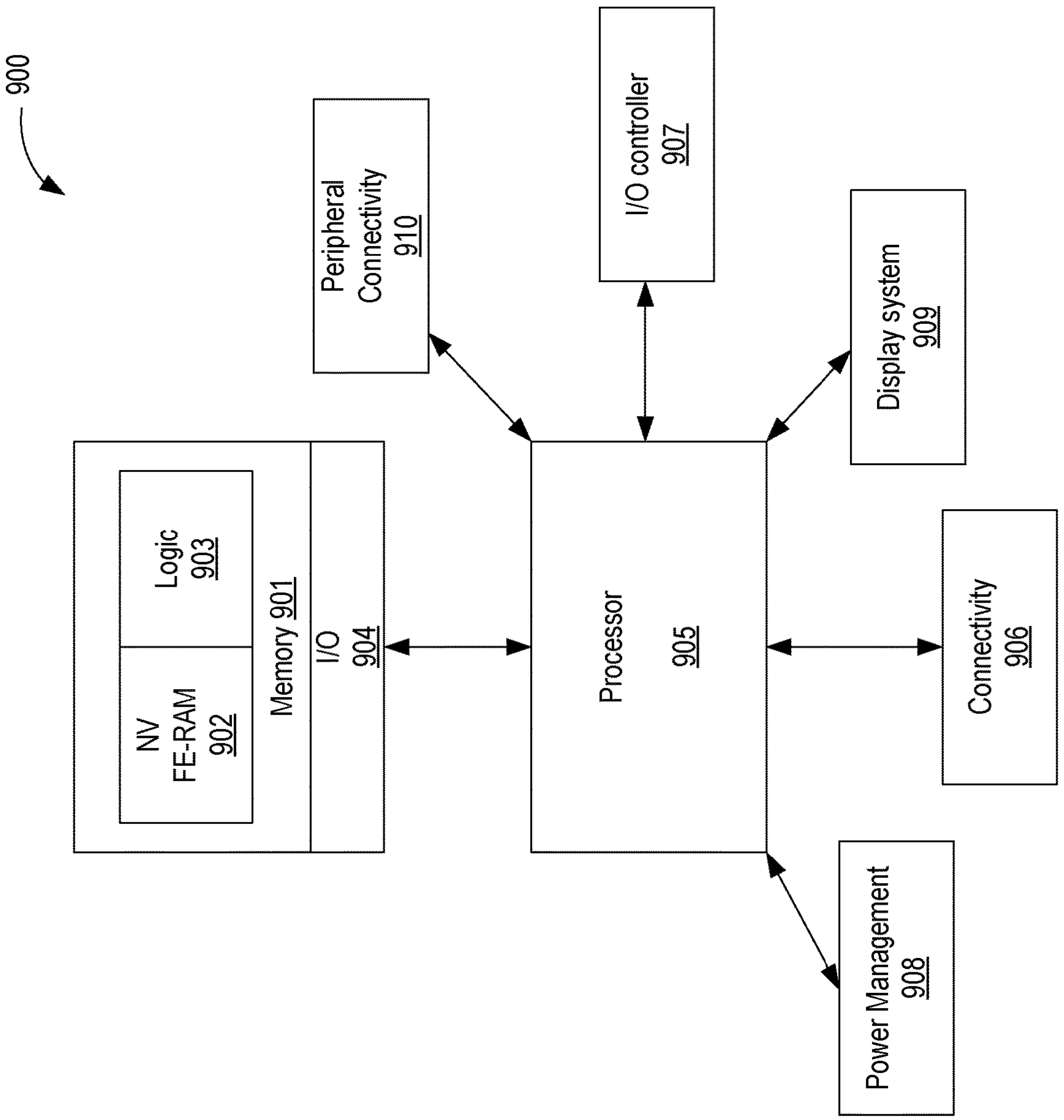
FIG. 9 illustrates a system-on-chip (SOC) that uses any of the FE device structure of various embodiments with templating or texturing layer, alone or in combination with other layers, in accordance with some embodiments.

FIG. 9 illustrates a system-on-chip (SOC) that uses the FE device structure of various embodiments with templating or texturing layer, in accordance with some embodiments. The FE device structure can be formed in the backend of SOC 900 while the transistors are formed in the frontend of SOC 900, in accordance with some embodiments. In some embodiments, the FE device structure and the transistors are formed in the backend of SOC 900. In some embodiments, the FE device structure and the transistors are formed in the frontend of the SOC 900. In some embodiments, SOC 900 comprises memory 901 having static random-access memory (SRAM) or FE based random access memory FE-RAM, or any other suitable memory. The memory can be non-volatile (NV) or volatile memory. Memory 901 may also comprise logic 903 to control memory 902. For example, write and read drivers are part of logic 903. These drivers and other logic are implemented using the majority or threshold gates of various embodiments. The logic can comprise majority or threshold gates and traditional logic (e.g., CMOS based NAND, NOR etc.).

SOC further comprises a memory I/O (input-output) interface 904. The interface may be double-data rate (DDR) compliant interface or any other suitable interface to communicate with a processor. Processor 905 of SOC 900 can be a single core or multiple core processor. Processor 905 can be a general-purpose processor (CPU), a digital signal processor (DSP), or an Application Specific Integrated Circuit (ASIC) processor. In some embodiments, processor 905 is an artificial intelligence (AI) processor (e.g., a dedicated AI processor, a processor circuitry, a graphics processor configured as an AI processor). In various embodiments, processor 905 (or processor circuitry 905) is configured to execute one or more instructions.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 905 has reduced latency of computing the training model and using the training model, which reduces the power consumption of such AI processor systems.

Processor 905 may be coupled to a number of other chiplets that can be on the same die as SOC 900 or on separate dies. These chiplets include connectivity circuitry 906, I/O controller 907, power management 908, and display system 909, and peripheral connectivity 910.

Connectivity 906 represents hardware devices and software components for communicating with other devices. Connectivity 906 may support various connectivity circuitries and standards. For example, connectivity 906 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 906 may support non-cellular standards such as WiFi.

I/O controller 907 represents hardware devices and software components related to interaction with a user. I/O controller 907 is operable to manage hardware that is part of an audio subsystem and/or display subsystem. For example, input through a microphone or other audio device can provide input or commands for one or more applications or functions of SOC 900. In some embodiments, I/O controller 907 illustrates a connection point for additional devices that connect to SOC 900 through which a user might interact with the system. For example, devices that can be attached to the SOC 900 might include microphone devices, speaker or stereo systems, video systems or other display devices, keyboard or keypad devices, or other I/O devices for use with specific applications such as card readers or other devices.

Power management 908 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 908 may accordingly put such logic into low power state without the worry of losing data. Power management may select a power state according to Advanced Configuration and Power Interface (ACPI) specification for one or all components of SOC 900.

Display system 909 represents hardware (e.g., display devices) and software (e.g., drivers) components that provide a visual and/or tactile display for a user to interact with the processor 905. In some embodiments, display system 909 includes a touch screen (or touch pad) device that provides both output and input to a user. Display system 909 may include a display interface, which includes the particular screen or hardware device used to provide a display to a user. In some embodiments, the display interface includes logic separate from processor 905 to perform at least some processing related to the display.

Peripheral connectivity 910 may represent hardware devices and/or software devices for connecting to peripheral devices such as printers, chargers, cameras, etc. Peripheral connectivity 910 say support communication protocols, e.g., PCIe (Peripheral Component Interconnect Express), USB (Universal Serial Bus), Thunderbolt, High Definition Multimedia Interface (HDMI), Firewire, and etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (e.g., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples illustrates the various embodiments. Any one example can be combined with other examples described herein.

Example 1: A ferroelectric device comprising: a first layer comprising ferroelectric material; a second layer over the first layer, the second layer comprising a metallic electrode; a third layer under the first layer, the third layer comprising a metallic electrode; and a fourth layer adjacent to the third layer, wherein the fourth layer is configured to induce crystallographic orientation in the first layer.

Example 2: The ferroelectric device of example 1, wherein the fourth layer is self-crystalized.

Example 3: The ferroelectric device of example 1, wherein the fourth layer is crystalline and has an in-plane lattice constant.

Example 4: The ferroelectric device of example 3, wherein the in-plane lattice constant is within about 5% of a lattice constant of the first layer, the third layer, and the fourth layer.

Example 5: The ferroelectric device of example 1, comprising: a fifth layer adjacent to the fourth layer, wherein the fifth layer comprises a barrier material that prevents oxygen and hydrogen diffusion; and a sixth layer adjacent to the second layer, wherein the sixth layer comprises a barrier material that prevents oxygen and hydrogen diffusion.

Example 6: The ferroelectric device of example 5, wherein the barrier material of the fifth layer or the sixth layer includes one of: a metal boride, a metal carbide, a metal nitride, an intermetallic, or an amorphous metal oxide.

Example 7: The ferroelectric device of example 5 comprising a substrate adjacent to the fifth layer.

Example 8: The ferroelectric device of example 7, wherein the substrate is one of: Si substrate, $SiO_2$ substrate, metal substrate, or a combination of them.

Example 9: The ferroelectric device of example 1, wherein the fourth layer comprises a material which is electrically conductive.

Example 10: The ferroelectric device of example 1, wherein: the ferroelectric material includes one or more of:

Pb, La, Zr, Ti, Bi, Fe, Mg, N, Hf, or Zr; the second layer or the third layer includes one or more of: Sr, Ru, O, La, Mn, or Ti; or the fourth layer comprises one or more of: Fe, Pt, Ir, Mn, Sr, Ru, O, Bi, Ca, or Cu.

Example 11: The ferroelectric device of example 1, wherein the ferroelectric material includes one of: $Pb_xLa_{1-x}Zr$ or $TiO_3$; pseudo-cubic $BiFeO_3$ with a lattice constant of about 3.97 angstroms; pseudo-cubic $La_xBi_{1-x}FeO_3$ with a lattice constant of about 3.96 angstroms; tetragonal $BaTiO_3$ with a lattice constant of about 4 angstroms; relaxor ferroelectrics including lead magnesium niobite-lead titanate (PMN-PT); or ferroelectric $Hf_{0.5}Zr_{0.5}O_2$ (HZO).

Example 12: The ferroelectric device of example 1, wherein the second layer or the third layer includes one of: orthorhombic $SrRuO_3$ with a lattice constant of about 3.93 angstroms; $La_{0.5}Sr_{0.5}CoO_3$ with a lattice constant of about 3.83 angstroms; $La_{0.5}Mn_{0.5}CoO_3$ with a lattice constant of about 3.88 angstroms; or La-doped $SrTiO_3$.

Example 13: The ferroelectric device of example 1, wherein the fourth layer comprises one of: FePt with a lattice constant of about 3.86 angstroms; IrMn3 with a lattice constant of about 3.78 angstroms; $Sr_2RuO_4$ with a lattice constant of about 3.84 angstroms; or BiSrCaCuO with a lattice constant of about 3.83 angstroms.

Example 14: The ferroelectric device of example 1, wherein the third layer has an in-plane lattice constant which is close to a lattice constant of the ferroelectric material and the fourth layer.

Example 15: A method of forming a ferroelectric device comprising: fabricating a first layer comprising ferroelectric material; fabricating a second layer over the first layer, the second layer comprising a metallic electrode; fabricating a third layer under the first layer, the third layer comprising a metallic electrode; and fabricating a fourth layer adjacent to the third layer, wherein the fourth layer induces crystallographic orientation in the first layer.

Example 16: The method of example 15, wherein the fourth layer is self-crystalized, and wherein the fourth layer has an in-plane lattice constant.

Example 17: The method of example 16, wherein the in-plane lattice constant is within about 5% of a lattice constant of the third layer and the first layer.

Example 18: The method of example 15, comprising: fabricating a fifth layer adjacent to the fourth layer, wherein the fifth layer comprises a barrier material that prevents oxygen and hydrogen diffusion; and fabricating a sixth layer adjacent to the second layer, wherein the sixth layer comprises a barrier material that prevents oxygen and hydrogen diffusion.

Example 19: A system comprising: a processor circuitry to execute one or more instructions; and a memory coupled to the processor circuitry, wherein the memory circuitry includes a ferroelectric device comprising: a first structure comprising ferroelectric material; a second structure over the first structure, the second structure comprising metallic electrode; a third structure under the first structure, the third structure comprising metallic electrode; a fourth structure adjacent to the third structure, wherein the fourth structure induces crystallographic orientation in the first structure; a fifth structure adjacent to the fourth structure, wherein the fifth structure comprises a barrier material that prevents oxygen and hydrogen diffusion; and a sixth structure adjacent to the second structure, wherein the sixth structure comprises a barrier material that prevents oxygen and hydrogen diffusion.

Example 20: The system of example 19, wherein the ferroelectric material includes one of: $Pb_xLa_{1-x}Zr$ or $TiO_3$; pseudo-cubic $BiFeO_3$ with a lattice constant of about 3.97 A; pseudo-cubic $La_xBi_{1-x}FeO_3$ with a lattice constant of about 3.96 A; tetragonal $BaTiO_3$ with a lattice constant of about 4 A; relaxor ferroelectrics including lead magnesium niobite-lead titanate (PMN-PT); or ferroelectric $Hf_{0.5}Zr_{0.5}O_2$ (HZO), wherein the second structure or the third structure includes one of: orthorhombic $SrRuO_3$ with a lattice constant of about 3.93 angstroms; $La_{0.5}Sr_{0.5}CoO_3$ with a lattice constant of about 3.83 angstroms; $La_{0.5}Mn_{0.5}CoO_3$ with a lattice constant of about 3.88 angstroms; or La-doped $SrTiO_3$; and wherein the fourth structure comprises one of: FePt with a lattice constant of about 3.86 angstroms; IrMn3 with a lattice constant of about 3.78 angstroms; $Sr_2RuO_4$ with a lattice constant of about 3.84 angstroms; or BiSrCaCuO with a lattice constant of about 3.83 angstroms.

Example 1a: A ferroelectric device comprising: a first structure comprising a ferroelectric material; a second structure over the first structure, the second structure comprising metallic electrode; and a third structure under the first structure, the third structure configured to induce crystallographic orientation in the first structure and also configured to provide conductive characteristics of a metallic electrode.

Example 2a: The ferroelectric device of example 1a, wherein the third structure is self-crystalized, and wherein the third structure is a single layer.

Example 3a: The ferroelectric device of example 1a, wherein the third structure is crystalline and has an in-plane lattice constant.

Example 4a: The ferroelectric device of example 3a, wherein the in-plane lattice constant is within about 5% of a lattice constant of the first structure.

Example 5a: The ferroelectric device of example 1a, comprising: fourth structure adjacent to the third structure, wherein the fourth structure comprises a barrier material that prevents oxygen and hydrogen diffusion; and fifth structure adjacent to the second structure, wherein the fifth structure comprises a barrier material that prevents oxygen and hydrogen diffusion.

Example 6a: The ferroelectric device of example 5a, wherein the barrier material of the fourth structure or the fifth structure includes one of: a metal boride, a metal carbide, a metal nitride, an intermetallic, or an amorphous metal oxide.

Example 7a: The ferroelectric device of example 5a comprising a substrate adjacent to the fourth structure, wherein the substrate is one of: Si substrate, $SiO_2$ substrate, metal substrate or a combination of them.

Example 8a: The ferroelectric device of example 1a, wherein: the ferroelectric material includes one or more of: Pb, La, Zr, Ti, Bi, Fe, Mg, N, Hf, or Zr; and the second structure or the third structure includes one or more of: Sr, Ru, O, La, Mn, or Ti.

Example 9a: The ferroelectric device of example 1a, wherein the ferroelectric material includes one of: $Pb_xLa_{1-x}Zr$ or $TiO_3$; pseudo-cubic $BiFeO_3$ with lattice constant of about 3.97 angstroms; pseudo-cubic $La_xBi_{1-x}FeO_3$ with lattice constant of about 3.96 angstroms; tetragonal $BaTiO_3$ with lattice constant of about 4 angstroms; relaxor ferroelectrics including lead magnesium niobite-lead titanate (PMN-PT); or ferroelectric $Hf_{0.5}Zr_{0.5}O_2$ (HZO).

Example 10a: The ferroelectric device of example 1a, wherein the second structure or the third structure includes one of: orthorhombic $SrRuO_3$ with lattice constant of about 3.93 angstroms; $SrRuO_4$; $La_{0.5}Sr_{0.5}CoO_3$; or $La_{0.7}Mn_{0.3}CoO_3$.

Example 11a: The ferroelectric device of example 1a, wherein the third structure has no reaction or interdiffusion with the ferroelectric material.

Example 12a: The ferroelectric device of example 1a, wherein the third structure comprises a super lattice of at least two materials including an intermetallic material and a metallic electrode material.

Example 13a: A method of forming a ferroelectric device comprising: fabricating a first structure comprising a ferroelectric material; fabricating a second structure over the first structure, the second structure comprising metallic electrode; and fabricating a third structure under the first structure, the third structure configured to induce crystallographic orientation in the first structure and also configured to provide conductive characteristics of a metallic electrode.

Example 14a: The method of example 13a, wherein the third structure is self-crystalized, and wherein the third structure is a single layer.

Example 15a: The method of example 13a, wherein the third structure is crystalline and has an in-plane lattice constant, and wherein the in-plane lattice constant is within about 5% of a lattice constant of the first structure.

Example 16a: The method of example 13a, comprising: fabricating fourth structure adjacent to the third structure, wherein the fourth structure comprises a barrier material that prevents oxygen and hydrogen diffusion; and fabricating fifth structure adjacent to the second structure, wherein the fifth structure comprises a barrier material that prevents oxygen and hydrogen diffusion, wherein the barrier material of the fourth structure or the fifth structure includes one of: a metal boride, a metal carbide, a metal nitride, an intermetallic, or an amorphous metal oxide.

Example 17a: The ferroelectric device of example 16a comprising forming a substrate adjacent to the fourth structure, wherein the substrate is one of: Si substrate, $SiO_2$ substrate, metal substrate or a combination of them.

Example 18a: The method of example 13a, wherein the ferroelectric material includes one of: $Pb_xLa_{1-x}Zr$ or $TiO_3$; pseudo-cubic $BiFeO_3$ with lattice constant of about 3.97 angstroms; pseudo-cubic $La_xBi_{1-x}FeO_3$ with lattice constant of about 3.96 angstroms; tetragonal $BaTiO_3$ with lattice constant of about 4 angstroms; relaxor ferroelectrics including lead magnesium niobite-lead titanate (PMN-PT); or ferroelectric $Hf_{0.5}Zr_{0.5}O_2$ (HZO); wherein the second structure or the third structure includes one of: orthorhombic $SrRuO_3$ with lattice constant of about 3.93 angstroms; $SrRuO_4$; $La_{0.5}Sr_{0.5}CoO_3$; or $La_{0.7}Mn_{0.3}CoO_3$; and wherein the third structure has no reaction or interdiffusion with the ferroelectric material.

Example 19a: A system comprising: a processor circuitry to execute one or more instructions; and a memory coupled to the processor circuitry, wherein the memory circuitry includes a ferroelectric device comprising: a first structure comprising a ferroelectric material; a second structure over the first structure, the second structure comprising metallic electrode; and a third structure under the first structure, the third structure configured to induce crystallographic orientation in the first structure and also configured to provide conductive characteristics of a metallic electrode.

Example 20a: The system of example 19a, wherein the ferroelectric material includes one of: $Pb_xLa_{1-x}Zr$ or $TiO_3$; pseudo-cubic $BiFeO_3$ with lattice constant of about 3.97 angstroms; pseudo-cubic $La_xBi_{1-x}FeO_3$ with lattice constant of about 3.96 angstroms; tetragonal $BaTiO_3$ with lattice constant of about 4 angstroms; relaxor ferroelectrics including lead magnesium niobite-lead titanate (PMN-PT); or ferroelectric $Hf_{0.5}Zr_{0.5}O_2$ (HZO); wherein the second structure or the third structure includes one of: orthorhombic $SrRuO_3$ with lattice constant of about 3.93 angstroms; $SrRuO_4$; $La_{0.5}Sr_{0.5}CoO_3$; or $La_{0.7}Mn_{0.3}CoO_3$; and wherein the third structure has no reaction or interdiffusion with the ferroelectric material.

Example 1b: A ferroelectric device comprising: a first structure comprising ferroelectric material; a second structure over the first structure, the second structure comprising metallic electrode; and a third structure under the first structure, the third structure configured to: induce crystallographic orientation in the first structure; provide conductive characteristics of an electrode; and provide diffusion barrier from oxygen and hydrogen.

Example 2b: The ferroelectric device of example 1b, wherein the third structure is self-crystalized, and wherein the third structure is a single layer.

Example 3b: The ferroelectric device of example 1b, wherein the third structure is crystalline and has an in-plane lattice constant.

Example 4b: The ferroelectric device of example 3b, wherein the in-plane lattice constant is within about 5% of a lattice constant of the first structure.

Example 5b: The ferroelectric device of example 1b, comprising: fourth structure adjacent to the second structure, wherein the fourth structure comprises a barrier material that prevents oxygen and hydrogen diffusion.

Example 6b: The ferroelectric device of example 5b, wherein the barrier material of the fourth structure includes one of: metal boride, metal carbide, metal nitride, intermetallic, or amorphous metal oxide.

Example 7b: The ferroelectric device of example 1b comprising a substrate adjacent to the third structure, wherein the substrate is one of: Si substrate, $SiO_2$ substrate, metal substrate, or a combination of them.

Example 8b: The ferroelectric device of example 1b, wherein: the ferroelectric material includes one or more of: Pb, La, Zr, Ti, Bi, Fe, Mg, N, Hf, or Zr; and the second structure or the third structure includes one or more of: Sr, Ru, O, La, Mn, or Ti.

Example 9b: The ferroelectric device of example 1b, wherein the ferroelectric material includes one of: $Pb_xLa_{1-x}Zr$ or $TiO_3$; pseudo-cubic $BiFeO_3$ with a lattice constant of about 3.97 angstroms; pseudo-cubic $La_xBi_{1-x}FeO_3$ with a lattice constant of about 3.96 angstroms; tetragonal $BaTiO_3$ with a lattice constant of about 4 angstroms; relaxor ferroelectrics including lead magnesium niobite-lead titanate (PMN-PT); or ferroelectric $Hf_{0.5}Zr_{0.5}O_2$ (HZO).

Example 10b: The ferroelectric device of example 1b, wherein the second structure or the third structure includes one of: orthorhombic $SrRuO_3$ with a lattice constant of about 3.93 angstroms; $SrRuO_4$; $La_{0.5}Sr_{0.5}CoO_3$; or $La_{0.7}Mn_{0.3}CoO_3$.

Example 11b: The ferroelectric device of example 1b, wherein the third structure has no reaction or interdiffusion with the ferroelectric material.

Example 12b: The ferroelectric device of example 1b, wherein the third structure includes an intermetallic material, and wherein the intermetallic material includes one of: $Ni_3Al$, $NiAl_3$, $Ti_3Al$, or $TiAl_3$.

Example 13b: The ferroelectric device of example 1b, wherein the third structure comprises a super lattice of at least three materials including an intermetallic material, a metallic electrode material, and a $O_2$ or $H_2$ diffusion barrier material.

Example 14b: A method of forming a ferroelectric device comprising: fabricating a first structure comprising ferroelectric material; fabricating a second structure over the first structure, the second structure comprising metallic electrode; and fabricating a third structure under the first structure, the third structure configured to: induce crystallographic orientation in the first structure; provide conductive characteristics of an electrode; and provide diffusion barrier from oxygen and hydrogen.

Example 15b: The method device of example 14b, wherein the third structure is self-crystalized, and wherein the third structure is a single layer, wherein the third structure is crystalline and has an in-plane lattice constant, and wherein the in-plane lattice constant is within about 5% of a lattice constant of the first structure.

Example 16b: The method device of example 14b, comprising: fabricating fourth structure adjacent to the second structure, wherein the fourth structure comprises a barrier material that prevents oxygen and hydrogen diffusion, wherein the barrier material of the fourth structure includes one of: metal boride, metal carbide, metal nitride, intermetallic, or amorphous metal oxide.

Example 17b: The method of example 14b, wherein the ferroelectric material includes one of: $Pb_xLa_{1-x}Zr$ or $TiO_3$; pseudo-cubic $BiFeO_3$ with a lattice constant of about 3.97 angstroms; pseudo-cubic $La_xBi_{1-x}FeO_3$ with a lattice constant of about 3.96 angstroms; tetragonal $BaTiO_3$ with a lattice constant of about 4 angstroms; relaxor ferroelectrics including lead magnesium niobite-lead titanate (PMN-PT); or ferroelectric $Hf_{0.5}Zr_{0.5}O_2$ (HZO); wherein the second structure or the third structure includes one of: orthorhombic $SrRuO_3$ with a lattice constant of about 3.93 angstroms; $SrRuO_4$; $La_{0.5}Sr_{0.5}CoO_3$; or $La_{0.7}Mn_{0.3}CoO_3$.

Example 18b: The method of example 14b, wherein the third structure includes an intermetallic material, and wherein the intermetallic material includes one of: $Ni_3Al$, $NiAl_3$, $Ti_3Al$, or $TiAl_3$.

Example 19b: A system comprising: a processor circuitry to execute one or more instructions; and a memory coupled to the processor circuitry, wherein the memory circuitry includes a ferroelectric device comprising: a first structure comprising ferroelectric material; a second structure over the first structure, the second structure comprising metallic electrode; and a third structure under the first structure, the third structure configured to: induce crystallographic orientation in the first structure; provide conductive characteristics of an electrode; and provide diffusion barrier from oxygen and hydrogen.

Example 20b: The system of example 19b, wherein the third structure includes an intermetallic material, and wherein the intermetallic material includes one of: $Ni_3Al$, $NiAl_3$, $Ti_3Al$, or $TiAl_3$.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A device comprising:

a first layer comprising non-linear polar material;

a second layer on the first layer, the second layer comprising a first metallic electrode;

a third layer under the first layer, the third layer comprising a second metallic electrode; and a fourth layer adjacent to the third layer, wherein the fourth layer comprises a material with a lattice constant which is substantially between 3.78 and 3.86 Angstrom.

2. The device of claim 1, wherein the material of the fourth layer comprises Fe and Pt.

3. The device of claim 1, wherein the material of the fourth layer includes Ir and Mn.

4. The device of claim 1, wherein the material of the fourth layer includes Sr, Ru, and O.

5. The device of claim 1, wherein the material of the fourth layer includes Bi, Sr, Ca, Cu, and O.

6. The device of claim 1, wherein the material of the fourth layer is to induce crystallographic orientation in the first layer.

7. The device of claim 1, wherein the fourth layer is self-crystalized.

8. The device of claim 1, wherein the fourth layer is crystalline and has an in-plane lattice constant.

9. The device of claim 8, wherein the in-plane lattice constant is within about 5% of a lattice constant of the first layer and the third layer.

10. The device of claim 1, comprising a fifth layer adjacent to the fourth layer, wherein the fifth layer comprises a first barrier material that prevents oxygen and hydrogen diffusion.

11. The device of claim 10, comprising a sixth layer adjacent to the second layer, wherein the sixth layer comprises a second barrier material that prevents oxygen and hydrogen diffusion.

12. The device of claim 10, wherein the first barrier material of the fifth layer includes one of:

a metal boride;

a metal carbide;

a metal nitride;

an intermetallic; or an amorphous metal oxide.

13. The device of claim 11, wherein the sixth layer includes one of:

a metal boride;

a metal carbide;

a metal nitride;

an intermetallic; or an amorphous metal oxide.

14. The device of claim 10 comprising a substrate adjacent to the fifth layer, wherein the substrate comprises one of: Si substrate, $SiO_2$ substrate, metal substrate, or a combination of them.

15. The device of claim 1, wherein:

the non-linear polar material includes one or more of: Pb, La, Zr, Ti, Bi, Fe, Mg, N, Hf, or Zr;

the second layer or the third layer includes one or more of: Sr, Ru, O, La, Mn, or Ti; or the fourth layer comprises one or more of: Fe, Pt, Ir, Mn, Sr, Ru, O, Bi, Ca, or Cu.

16. The device of claim 1, wherein the third layer has an in-plane lattice constant which is close to a lattice constant of the non-linear polar material and the fourth layer.

17. The device of claim 1, wherein the second layer or the third layer has a lattice constant which is substantially between 3.83 and 3.93.

18. The device of claim 1, wherein the non-linear polar material has a lattice constant which is substantially between 3.96 and 4.00.

19. A method comprising:

forming a first layer comprising non-linear polar material;

forming a second layer on the first layer, the second layer comprising a first metallic electrode;

forming a third layer under the first layer, the third layer comprising a second metallic electrode; and forming a fourth layer adjacent to the third layer, wherein the fourth layer comprises a material with a lattice constant which is substantially between 3.78 and 3.86 Angstrom.

20. A system comprising:

a processor circuitry;

a memory coupled to the processor circuitry;

a communication interface to allow the processor circuitry to communicate with another device, wherein the memory includes:

a first layer comprising non-linear polar material;

a second layer on the first layer, the second layer comprising a first metallic electrode;

a third layer under the first layer, the third layer comprising a second metallic electrode; and a fourth layer adjacent to the third layer, wherein the fourth layer comprises a material with a lattice constant which is substantially between 3.78 and 3.86 Angstrom.

* * * * *